US012648250B2

(12) United States Patent
Noh et al.

(10) Patent No.: US 12,648,250 B2
(45) Date of Patent: Jun. 2, 2026

(54) IMAGE SENSOR AND A METHOD OF MANUFACTURING THE SAME

(71) Applicant: SAMSUNG ELECTRONICS CO., LTD., Suwon-si (KR)

(72) Inventors: Jonghyeon Noh, Suwon-si (KR); Kook Tae Kim, Suwon-si (KR); Jingyun Kim, Suwon-si (KR); Byeongtaek Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 335 days.

(21) Appl. No.: 18/388,712

(22) Filed: Nov. 10, 2023

(65) Prior Publication Data

US 2024/0266376 A1 Aug. 8, 2024

(30) Foreign Application Priority Data

Feb. 7, 2023 (KR) ........................ 10-2023-0016351

(51) Int. Cl.
H01L 27/146 (2006.01)
H10F 39/00 (2025.01)

(52) U.S. Cl.
CPC ......... H10F 39/807 (2025.01); H10F 39/014 (2025.01)

(58) Field of Classification Search
CPC .. H10F 39/807; H10F 39/199; H10F 39/8063; H10F 39/8053; H10F 39/802; H10F 39/8057; H10F 39/014
See application file for complete search history.

(56) References Cited

U.S. PATENT DOCUMENTS

| | | | |
|---|---|---|---|
| 7,154,136 B2 | 12/2006 | Cole et al. | |
| 7,679,130 B2 * | 3/2010 | Tilke ...................... | H10B 41/49 |
| | | | 257/376 |
| 8,975,155 B2 * | 3/2015 | Chuang ................ | H10D 62/115 |
| | | | 257/E21.546 |
| 9,437,470 B2 * | 9/2016 | Lu ......................... | H10D 30/023 |
| 10,658,409 B2 * | 5/2020 | Li .......................... | H10F 39/024 |
| 10,700,114 B2 | 6/2020 | Honda et al. | |
| 10,872,918 B2 | 12/2020 | Huang et al. | |

(Continued)

FOREIGN PATENT DOCUMENTS

| | | | | |
|---|---|---|---|---|
| CN | 105552092 A | * | 5/2016 | ........... H10D 86/201 |
| KR | 10-2020-0087544 A | | 7/2020 | |

(Continued)

*Primary Examiner* — Lawrence C Tynes, Jr.
(74) *Attorney, Agent, or Firm* — Sughrue Mion, PLLC

(57) ABSTRACT

An image sensor includes a substrate including a plurality of pixel regions, a first surface, and a second surface that is opposite to the first surface, and a deep device isolation pattern penetrating the substrate and between the plurality of pixel regions, the deep device isolation pattern including a first filling pattern adjacent to the second surface, a second filling pattern on the first filling pattern and adjacent to the first surface, a semiconductor pattern between the first filling pattern and the substrate, an oxidized semiconductor pattern on the semiconductor pattern and between the substrate and the second filling pattern, and a side insulating pattern between the semiconductor pattern and the substrate, where the semiconductor pattern directly contacts the oxidized semiconductor pattern.

20 Claims, 20 Drawing Sheets

(56) References Cited

U.S. PATENT DOCUMENTS

| | | | |
|---|---|---|---|
| 11,121,163 B2 | 9/2021 | Kim | |
| 11,239,269 B2 | 2/2022 | Kim et al. | |
| 2014/0183606 A1 | 7/2014 | Kakehi et al. | |
| 2021/0193706 A1* | 6/2021 | Kim | H10F 39/8053 |
| 2021/0273123 A1* | 9/2021 | Yang | H10F 39/199 |
| 2022/0223636 A1 | 7/2022 | Kim et al. | |
| 2022/0230909 A1 | 7/2022 | Li et al. | |

FOREIGN PATENT DOCUMENTS

| | | |
|---|---|---|
| KR | 10-2020-0087909 A | 7/2020 |
| KR | 10-2020-0099253 A | 8/2020 |
| KR | 10-2023-0013704 A | 1/2023 |

* cited by examiner

FIG. 17

IMAGE SENSOR AND A METHOD OF MANUFACTURING THE SAME

CROSS-REFERENCE TO RELATED APPLICATIONS

This application is based on and claims priority under 35 U.S.C. § 119 to Korean Patent Application No. 10-2023-0016351, filed on Feb. 7, 2023, in the Korean Intellectual Property Office, the disclosure of which is incorporated herein by reference in its entirety.

BACKGROUND

The present disclosure relates to an image sensor and a method of manufacturing the same, and more particularly, to a complementary metal-oxide-semiconductor (CMOS) image sensor and a method of manufacturing the same An image sensor may refer to a semiconductor device for converting an optical image into electrical signals. Image sensors may be categorized as, for example, charge coupled device (CCD) image sensors (CIS) and CMOS image sensors. As computer and communication industries have been developed, high-performance image sensors have been increasingly demanded in various devices, such as a digital camera, a camcorder, a personal communication system (PCS), a game console, a security camera, and a medical micro camera.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Example embodiments provide an image sensor capable of improving efficiency of a manufacturing process and a method of manufacturing the same.

According to an aspect of an example embodiment, an image sensor includes a substrate including a plurality of pixel regions, a first surface, and a second surface that is opposite to the first surface, and a deep device isolation pattern penetrating the substrate and between the plurality of pixel regions, the deep device isolation pattern including a first filling pattern adjacent to the second surface, a second filling pattern on the first filling pattern and adjacent to the first surface, a semiconductor pattern between the first filling pattern and the substrate, an oxidized semiconductor pattern on the semiconductor pattern and between the substrate and the second filling pattern, and a side insulating pattern between the semiconductor pattern and the substrate, where the semiconductor pattern directly contacts the oxidized semiconductor pattern.

According to an aspect of an example embodiment, a method of manufacturing an image sensor includes preparing a substrate including a first surface and a second surface that is opposite to the first surface, forming a deep trench extending from the first surface into the substrate, forming a side insulating layer at least partially covering an inner surface of the deep trench, forming a semiconductor layer at least partially covering the side insulating layer, forming a first filling layer filling the deep trench on the semiconductor layer, forming a second trench and a first filling pattern by performing etching on the first filling layer, and forming an oxidized semiconductor layer by oxidizing a first portion of the semiconductor layer which is exposed by the second trench, where a second portion of the semiconductor layer that is different from the first portion of the semiconductor layer is formed into a semiconductor pattern.

According to an aspect of an example embodiment, an image sensor includes a substrate including a plurality of pixel regions, a first surface, and a second surface that is opposite to the first surface, where the plurality of pixel regions are arranged in a first direction and a second direction that are intersecting and that are parallel to the second surface, a deep device isolation pattern extending from the first surface into the substrate in a third direction perpendicular to the second surface and that is between the plurality of pixel regions, and a shallow device isolation pattern adjacent to the first surface, where the deep device isolation pattern includes a first filling pattern adjacent to the second surface, a second filling pattern on the first filling pattern and penetrating the shallow device isolation pattern, a semiconductor pattern between the first filling pattern and the substrate, an oxidized semiconductor pattern on the semiconductor pattern, and between the shallow device isolation pattern and the second filling pattern, and a side insulating pattern between the semiconductor pattern and the substrate.

BRIEF DESCRIPTION OF DRAWINGS

The above and other aspects, features, and advantages of certain example embodiments of the present disclosure will be more apparent from the following description taken in conjunction with the accompanying drawings, in which:

FIGS. 10, 11, 12, 13, 14, 15, 16 and 17 are cross-sectional views corresponding to the line A-A' of FIG. 3 and illustrating a method of manufacturing an image sensor according to one or more embodiments of the disclosure;

DETAILED DESCRIPTION

Example embodiments of the disclosure will be described more fully with reference to the accompanying drawings.

Figure 1:
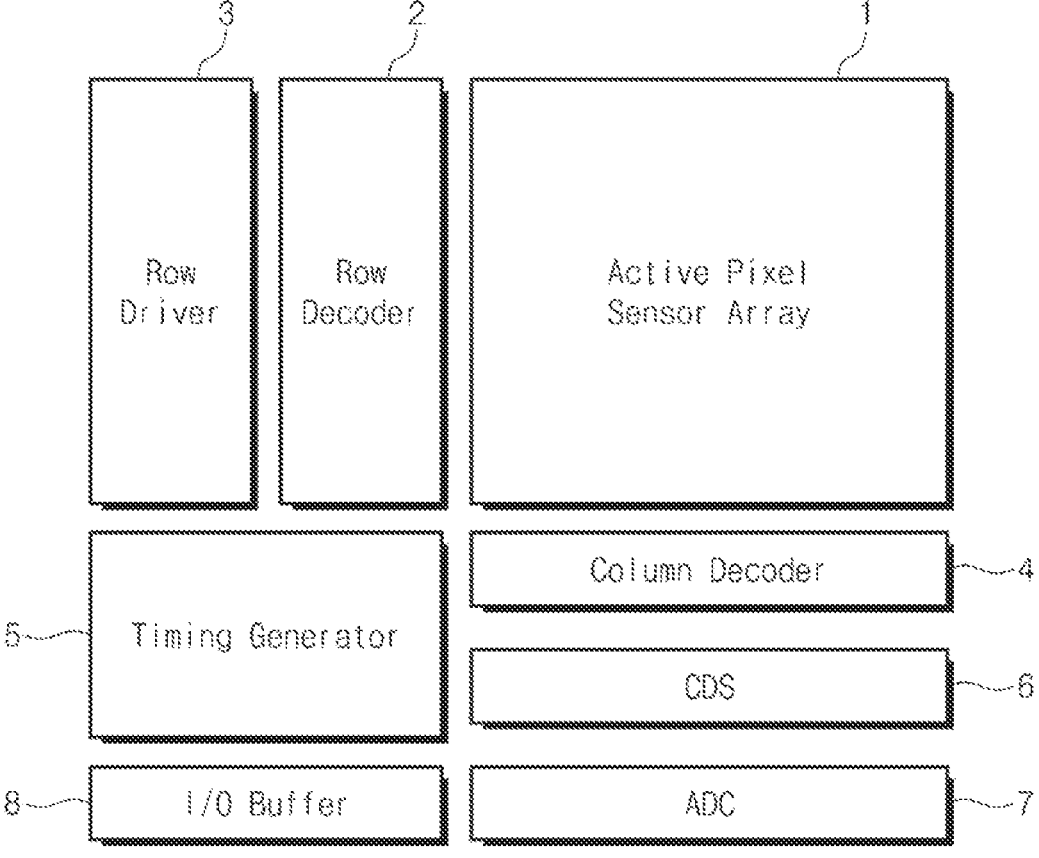
FIG. 1 is a block diagram illustrating an image sensor according to one or more embodiments of the disclosure.

FIG. 1 is a block diagram illustrating an image sensor according to one or more embodiments of the disclosure.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of pixels arranged two-dimensionally and may convert optical signals into electrical signals. The active pixel sensor array 1 may be driven by a plurality of driving signals (e.g., a pixel selection signal, a reset signal, and a charge transfer signal) provided from the row driver 3. In addition, the electrical signals converted by the active pixel sensor array 1 may be provided to the correlated double sampler 6.

The row driver 3 may provide the plurality of driving signals for driving the plurality of pixels to the active pixel sensor array 1 in response to signals decoded in the row decoder 2. When the pixels are arranged in a matrix form, the driving signals may be provided in the unit of row of the matrix form.

The timing generator 5 may provide timing signals and control signals to the row decoder 2 and the column decoder 4.

The CDS 6 may receive electrical signals generated from the active pixel sensor array 1 and may hold and sample the received electrical signals. The CDS 6 may doubly sample a specific noise level and a signal level of the electrical signal and may output a difference level corresponding to a difference between the noise level and the signal level.

The ADC 7 may convert an analog signal, which corresponds to the difference level outputted from the CDS 6, into a digital signal and may output the digital signal.

The I/O buffer 8 may latch the digital signals and may sequentially output the latched signals to an image signal processing unit in response to signals decoded in the column decoder 4.

Figure 2:
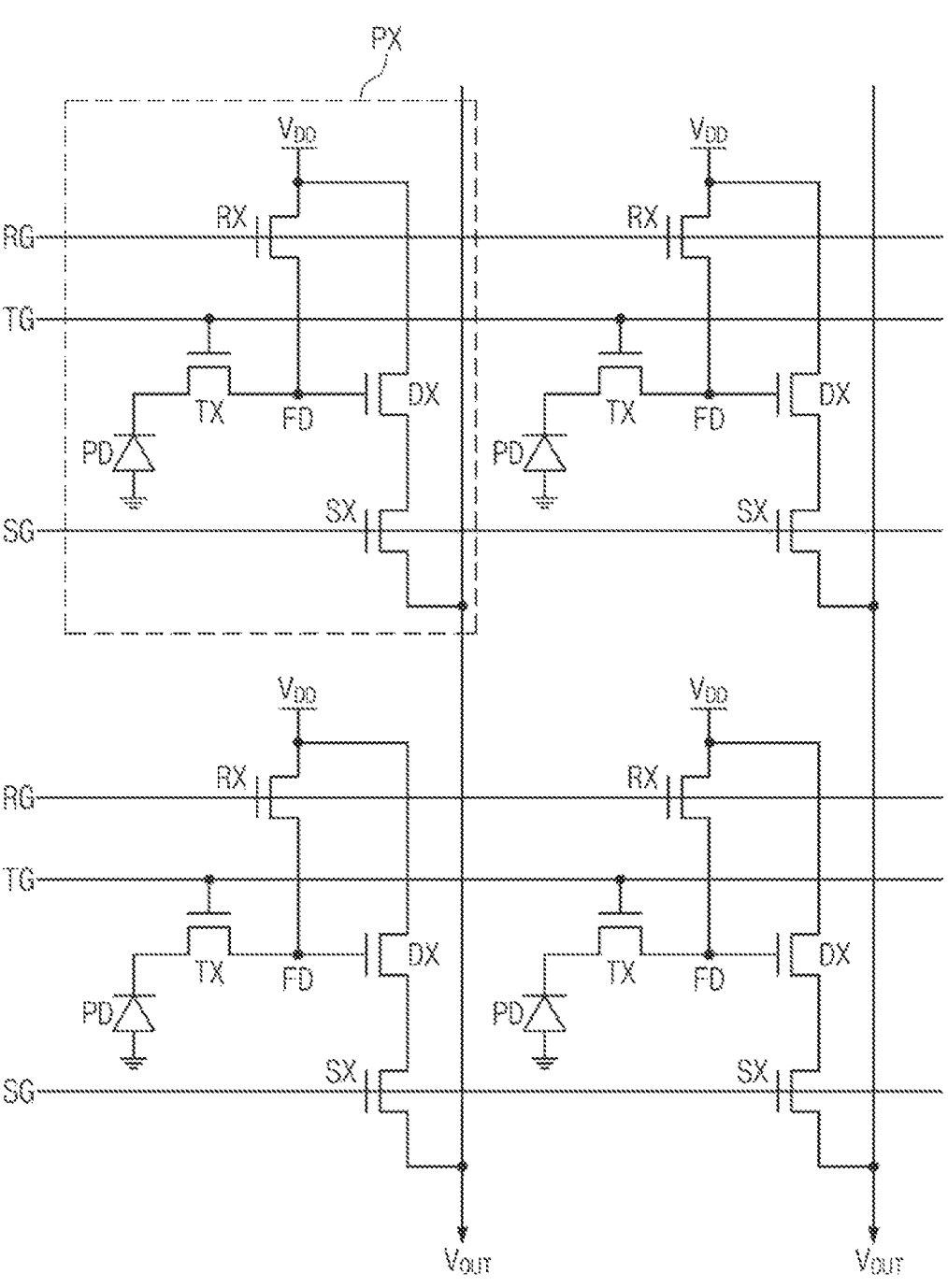
FIG. 2 is a circuit diagram illustrating an active pixel sensor array of an image sensor according to one or more embodiments of the disclosure.

FIG. 2 is a circuit diagram illustrating an active pixel sensor array of an image sensor according to one or more embodiments of the disclosure.

Referring to FIGS. 1 and 2, the active pixel sensor array 1 may include the plurality of pixels PX, and the pixels PX may be arranged in a matrix form. Each of the pixels PX may include a transfer transistor TX and logic transistors RX, SX and DX. The logic transistors may include a reset transistor RX, a selection transistor SX, and a drive transistor DX. The transfer transistor TX, the reset transistor RX and the selection transistor SX may include a transfer gate TG, a reset gate RG and a selection gate SG, respectively. Each of the pixels PX may further include a photoelectric conversion element PD and a floating diffusion region FD.

The photoelectric conversion element PD may generate and accumulate photocharges in proportion to the amount of light incident from the outside. The photoelectric conversion element PD may be a photodiode including a P-type dopant region and an N-type dopant region. The transfer transistor TX may transfer photocharges (or charges) generated from the photoelectric conversion element PD to the floating diffusion region FD. The floating diffusion region FD may receive the charges generated from the photoelectric conversion element PD and may cumulatively store the received charges. The drive transistor DX may be controlled according to the amount of the charges accumulated in the floating diffusion region FD.

The reset transistor RX may periodically reset the charges accumulated in the floating diffusion region FD. A drain electrode of the reset transistor RX may be connected to the floating diffusion region FD, and a source electrode of the reset transistor RX may be connected to a power voltage $V_{DD}$. When the reset transistor RX is turned-on, the power voltage $V_{DD}$ connected to the source electrode of the reset transistor RX may be applied to the floating diffusion region FD. Thus, when the reset transistor RX is turned-on, the charges accumulated in the floating diffusion region FD may be discharged to reset the floating diffusion region FD.

The drive transistor DX may function as a source follower buffer amplifier. The drive transistor DX may amplify a potential change in the floating diffusion region FD and may output the amplified potential change to an output line VOUT.

The selection transistor SX may select the pixels PX to be read in the unit of row. When the selection transistor SX is turned-on, the power voltage $V_{DD}$ may be applied to a drain electrode of the drive transistor DX.

The pixel PX including a single photoelectric conversion element PD and four transistors TX, RX, DX and SX is illustrated in FIG. 2, but embodiments of the disclosure are not limited thereto. In one or more embodiments, the reset transistor RX, the drive transistor DX or the selection transistor SX may be shared by adjacent pixels PX. Thus, an integration density of the image sensor may be improved.

Figure 3:
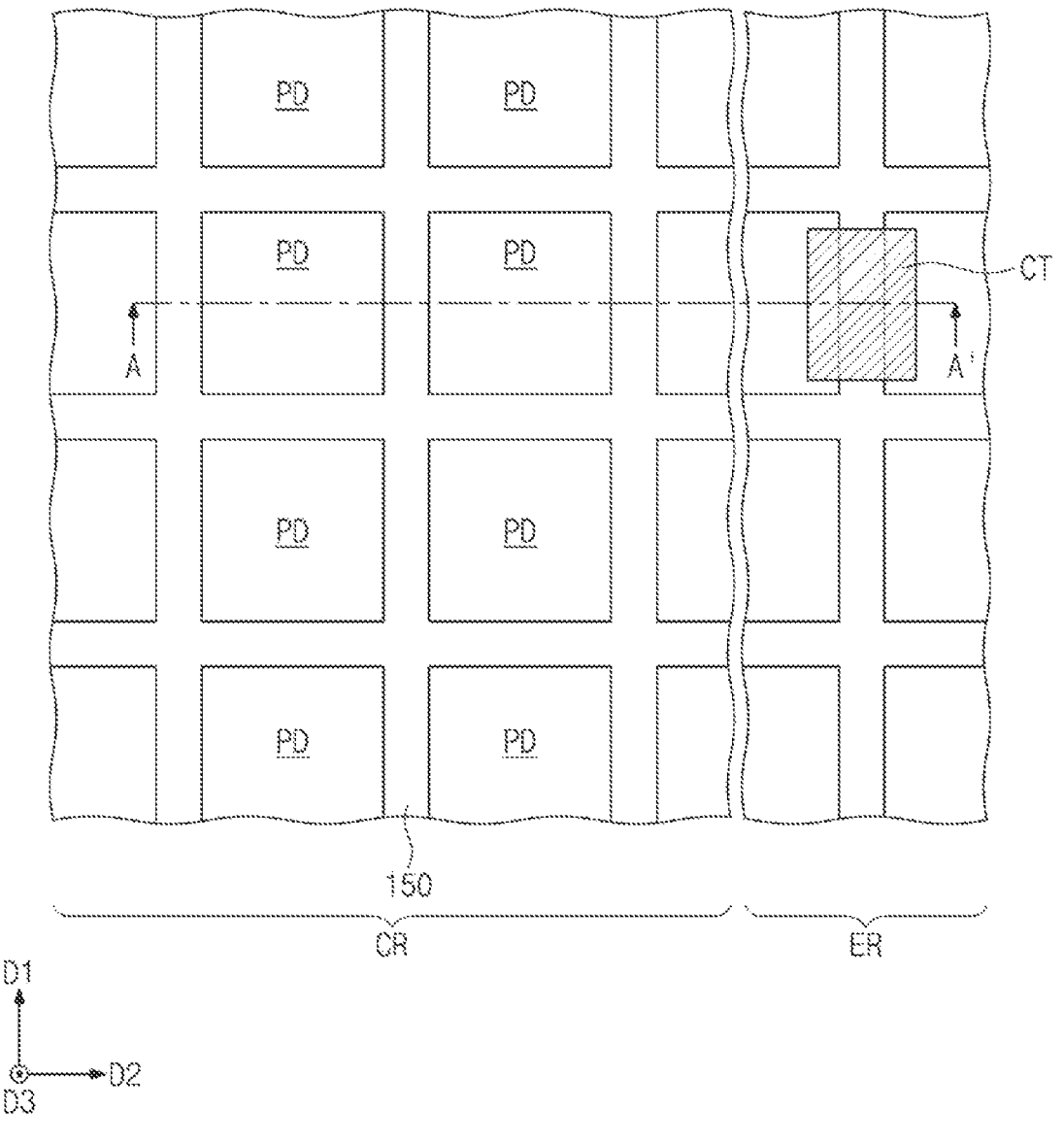
FIG. 3 is a plan view illustrating an image sensor according to one or more embodiments of the disclosure.
Figure 4:
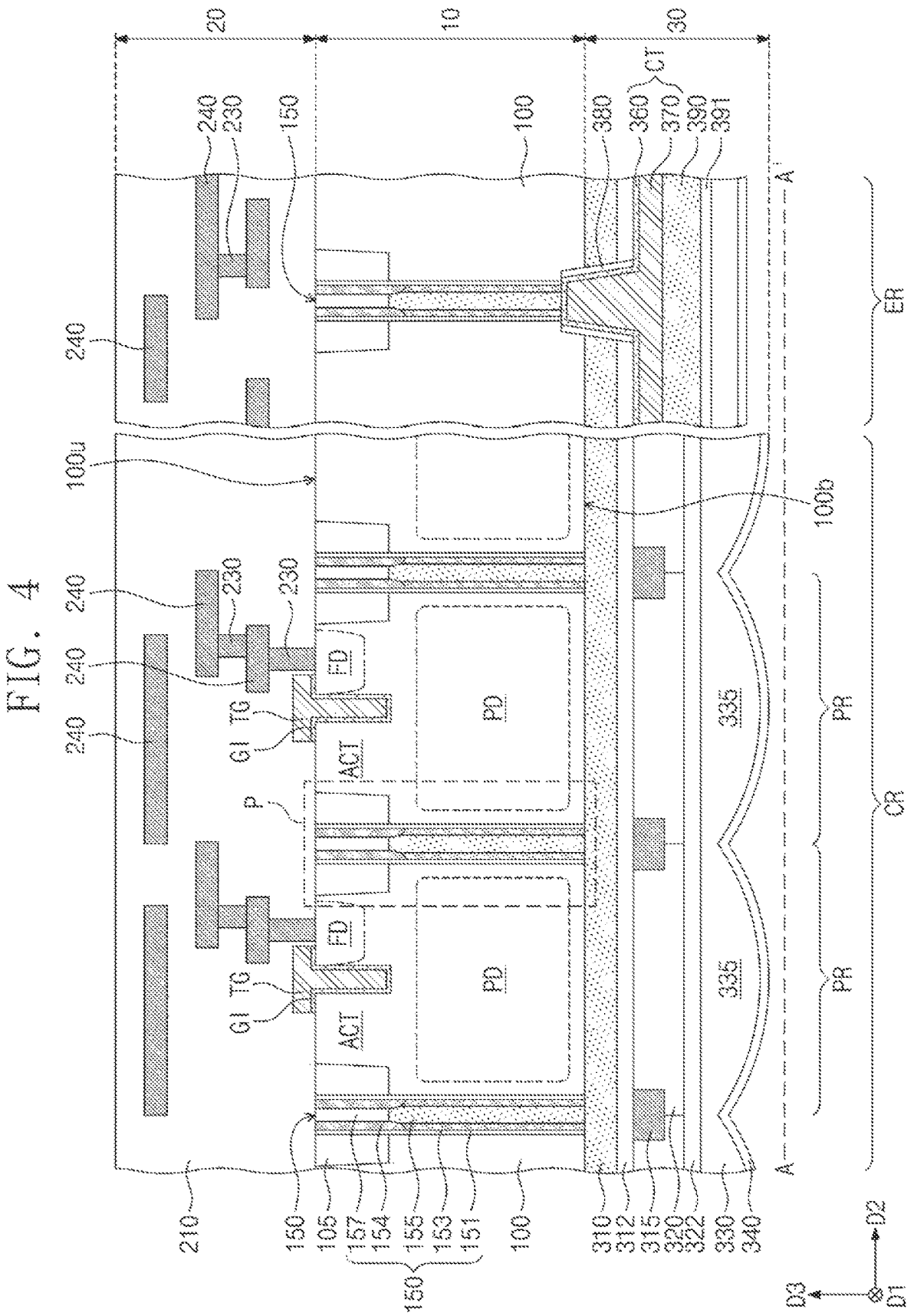
FIG. 4 is a cross-sectional view corresponding to a line A-A' of FIG. 3 according to one or more embodiments of the disclosure.

FIG. 3 is a plan view illustrating an image sensor according to one or more embodiments of the disclosure. FIG. 4 is a cross-sectional view corresponding to a line A-A' of FIG. 3 according to one or more embodiments of the disclosure.

Referring to FIGS. 3 and 4, an image sensor may include a photoelectric conversion layer 10, an interconnection layer 20, and a light transmitting layer 30. The photoelectric conversion layer 10 may be disposed between the interconnection layer 20 and the light transmitting layer 30.

The photoelectric conversion layer 10 may include a substrate 100, and the substrate 100 may include a central region CR and an edge region ER surrounding the central region CR in a plan view. The central region CR of the substrate 100 may include a plurality of pixel regions PR. The substrate 100 may be a semiconductor substrate (e.g., a silicon substrate, a germanium substrate, a silicon-germanium substrate, a group II-VI compound semiconductor substrate, or a group III-V compound semiconductor substrate) or a silicon-on-insulator (SOI) substrate. The substrate 100 may have a first surface 100$u$ and a second surface 100$b$, which are opposite to each other. The pixel regions PR may be two-dimensionally arranged in a first direction D1 and a second direction D2, which are parallel to the first surface 100$u$ of the substrate 100. The first direction D1 and the second direction D2 may intersect (e.g., be perpendicular to) each other.

The photoelectric conversion layer 10 may include a deep device isolation pattern 150 which penetrates the substrate 100 and is disposed between the pixel regions PR. The pixel regions PR may be defined by the deep device isolation pattern 150. The deep device isolation pattern 150 may penetrate the substrate 100 in a third direction D3 perpendicular to the first surface 100$u$ and may extend from the first surface 100$u$ toward the second surface 100$b$. The first surface 100$u$ may expose a top surface of the deep device isolation pattern 150 and may be substantially coplanar with the top surface of the deep device isolation pattern 150. The second surface 100$b$ may expose a bottom surface of the deep device isolation pattern 150 and may be substantially coplanar with the bottom surface of the deep device isolation pattern 150. The deep device isolation pattern 150 may prevent cross-talk between the pixel regions PR adjacent to each other.

The deep device isolation pattern 150 may include a side insulating pattern 151, a semiconductor pattern 153, an oxidized semiconductor pattern 154, a first filling pattern 155, and a second filling pattern 157.

The first filling pattern 155 may be disposed adjacent to the second surface 100b of the substrate 100. A bottom surface of the first filling pattern 155 may be exposed at the second surface 100b. The bottom surface of the first filling pattern 155 may be substantially coplanar with the second surface 100b. The first filling pattern 155 may extend from the second surface 100b toward the first surface 100u. For example, the first filling pattern 155 may include at least one of silicon, silicon oxide, silicon nitride, and silicon oxynitride.

The second filling pattern 157 may be disposed on the first filling pattern 155. The second filling pattern 157 may be disposed adjacent to the first surface 100u. A top surface of the second filling pattern 157 may be exposed at the first surface 100u. The top surface of the second filling pattern 157 may be substantially coplanar with the first surface 100u. The second filling pattern 157 may extend from the first surface 100u toward the second surface 100b. For example, the second filling pattern 157 may include silicon oxide and/or an air gap.

The semiconductor pattern 153 may be disposed between the first filling pattern 155 and the substrate 100. The semiconductor pattern 153 may be adjacent to the second surface 100b. The first filling pattern 155 may be spaced apart from the substrate 100 with the semiconductor pattern 153 interposed therebetween. The semiconductor pattern 153 may extend from the second surface 100b toward the first surface 100u. The semiconductor pattern 153 may include a semiconductor material doped with P-type or N-type dopants. For example, the semiconductor pattern 153 may include poly-silicon doped with boron.

The oxidized semiconductor pattern 154 may be disposed on the semiconductor pattern 153. The oxidized semiconductor pattern 154 may be disposed between the substrate 100 and the second filling pattern 157. The oxidized semiconductor pattern 154 may be adjacent to the first surface 100u. The second filling pattern 157 may be spaced apart from the substrate 100 with the oxidized semiconductor pattern 154 interposed therebetween. The oxidized semiconductor pattern 154 may extend from the first surface 100u toward the second surface 100b. The oxidized semiconductor pattern 154 may directly contact the semiconductor pattern 153. A bottom surface of the oxidized semiconductor pattern 154 may directly contact a top surface of the semiconductor pattern 153. The oxidized semiconductor pattern 154 may include an oxide of a semiconductor material doped with P-type or N-type dopants. For example, the oxidized semiconductor pattern 154 may include an oxide of the semiconductor material included in the semiconductor pattern 153. For example, the oxidized semiconductor pattern 154 may include silicon oxide doped with boron.

The side insulating pattern 151 may be disposed between the semiconductor pattern 153 and the substrate 100 and between the oxidized semiconductor pattern 154 and the substrate 100. The side insulating pattern 151 may contact the semiconductor pattern 153 and the oxidized semiconductor pattern 154. The side insulating pattern 151 may penetrate the substrate 100 in the third direction D3 and may surround or at least partially surround the pixel region PR in a plan view. The side insulating pattern 151 may include silicon oxide. For some examples, the side insulating pattern 151 may be a single layer including silicon oxide. For certain examples, the side insulating pattern 151 may be a multi-layer including silicon oxide.

A photoelectric conversion region PD may be disposed in each of the pixel regions PR. The photoelectric conversion region PD may be adjacent to other photoelectric conversion regions PD in the first direction D1 and the second direction D2. The substrate 100 may have a first conductivity type, and the photoelectric conversion region PD may be a region doped with dopants having a second conductivity type different from the first conductivity type. For example, the first conductivity type and the second conductivity type may be a P-type and an N-type, respectively. In this case, the dopants having the second conductivity type may include N-type dopants such as phosphorus, arsenic, bismuth, and/or antimony. The photoelectric conversion region PD may form a PN junction with the substrate 100 to form a photodiode.

A shallow device isolation pattern 105 may be disposed adjacent to the first surface 100u and may extend from the first surface 100u into the substrate 100. Each of the pixel regions PR may include an active pattern ACT defined by the shallow device isolation pattern 105. A top surface of the shallow device isolation pattern 105 may be exposed at the first surface 100u. For example, the shallow device isolation pattern 105 may include at least one of a silicon oxide layer, a silicon nitride layer, and a silicon oxynitride layer.

The deep device isolation pattern 150 may penetrate the shallow device isolation pattern 105 and may extend into the substrate 100. At least a portion of the second filling pattern 157 of the deep device isolation pattern 150 may be disposed in the shallow device isolation pattern 105. For example, the second filling pattern 157 may penetrate the shallow device isolation pattern 105 and may contact the first filling pattern 155. The side insulating pattern 151 of the deep device isolation pattern 150 may extend between the shallow device isolation pattern 105 and the second filling pattern 157.

A transfer gate electrode TG and a floating diffusion region FD may be disposed on the first surface 100u of each of the pixel regions PR. For example, the transfer gate electrode TG and the floating diffusion region FD may be disposed on the active pattern ACT of each of the pixel regions PR.

The transfer gate electrode TG and the floating diffusion region FD may constitute the transfer transistor TX of FIG. 2. A lower portion of the transfer gate electrode TG may penetrate the active pattern ACT and may extend into the substrate 100. An upper portion of the transfer gate electrode TG may protrude above a top surface of the active pattern ACT (i.e., the first surface 100u of the substrate 100). The floating diffusion region FD may be disposed in the active pattern ACT at a side of the transfer gate electrode TG. The floating diffusion region FD may be a region doped with dopants (e.g., N-type dopants) having the second conductivity type different from the first conductivity type of the substrate 100. A gate dielectric layer GI may be disposed between the transfer gate electrode TG and the active pattern ACT.

The interconnection layer 20 may be disposed on the first surface 100u of the substrate 100. The interconnection layer 20 may include an interlayer insulating layer 210 stacked on the first surface 100u of the substrate 100. The interlayer insulating layer 210 may cover or at least partially cover the first surface 100u, the top surface of the deep device isolation pattern 150, and the top surface of the shallow device isolation pattern 105. The interlayer insulating layer 210 may be disposed on the first surface 100u of the substrate 100 to also cover or at least partially cover the transistors constituting the pixels PX of FIG. 2.

The interconnection layer 20 may further include contact plugs 230 and conductive lines 240. The contact plugs 230 may be electrically connected to the transistors, and the conductive lines 240 may be electrically connected to the contact plugs 230. The interlayer insulating layer 210 may include an insulating material, and the contact plugs 230 and the conductive lines 240 may include a conductive material.

The light transmitting layer 30 may be disposed on the second surface 100b of the substrate 100. The light transmitting layer 30 may include a color filter array 320 and a micro lens array 330, which are disposed on the second surface 100b. The color filter array 320 may be disposed between the second surface 100b and the micro lens array 330. The light transmitting layer 30 may collect and filter light incident from the outside and may provide the light to the photoelectric conversion layer 10.

The color filter array 320 may include a plurality of color filters 320 disposed on the pixel regions PR, respectively. In some embodiments, four pixel regions arranged in a 2×2 matrix form may be configured to realize the same color. The micro lens array 330 may include micro lenses, such as micro lenses 335 disposed on the color filters 320. The micro lenses 335 may be positioned vertically below the photoelectric conversion regions PD (e.g., in the + third direction D3) and may have a horizontal width that is greater than a horizontal width of a photoelectric conversion region PD (at least in the cross-sectional view). A passivation layer 340 may cover or at least partially cover the micro lenses 335 and/or the entire micro lens array 330. The micro lens array 330 and the passivation layer 340 may extend onto the edge region ER and may have a flat shape parallel to the second surface 100b on the edge region ER.

An anti-reflection layer 310 may be disposed between the second surface 100b and the color filter array 320. The anti-reflection layer 310 may prevent reflection of light incident to the second surface 100b of the substrate 100 to allow the light to smoothly reach the photoelectric conversion region PD. A first insulating layer 312 may be disposed between the anti-reflection layer 310 and the color filter array 320, and a second insulating layer 322 may be disposed between the color filter array 320 and the micro lens array 330. A grid 315 may be disposed between the first insulating layer 312 and the color filter array 320. The grid 315 may be positioned vertically below the deep device isolation pattern 150 (e.g., in the + third direction D3), and the grid 315 may have a horizontal width that is greater than the horizontal width of the deep device isolation pattern 150 (at least in the cross-sectional view). The grid 315 may guide light incident to the second surface 100b to allow the light to be incident into the photoelectric conversion region PD. For example, the grid 315 may include a metal. The color filter array 320 may extend into holes defined by the grid 315 so as to contact the first insulating layer 312.

A contact pattern CT may be disposed on the edge region ER and may be disposed adjacent to the second surface 100b. The contact pattern CT may penetrate the anti-reflection layer 310 and the first insulating layer 312 and may extend in the substrate 100 so as to contact a bottom surface of the semiconductor pattern 153. The contact pattern CT may include a metal pattern 370 extending from a bottom surface of the first insulating layer 312 into the substrate 100, and a barrier pattern 360 surrounding or at least partially surrounding the metal pattern 370.

A contact insulating layer 380 may surround or at least partially surround the contact pattern CT. The contact pattern CT may extend onto another region so as to be electrically connected to a through-silicon via (TSV) or a back vias stack (BVS). Therefore, a negative bias voltage may be applied to the semiconductor pattern 153 through the contact pattern CT, and thus a white spot or a dark current may be minimized or prevented.

A bulk color filter 390 and a first protective layer 391 may be sequentially provided on the contact pattern CT provided on the edge region ER. The bulk color filter 390 may be disposed between the contact pattern CT and the micro lens array 330, and the first protective layer 391 may be disposed between the bulk color filter 390 and the micro lens array 330.

Figure 5:
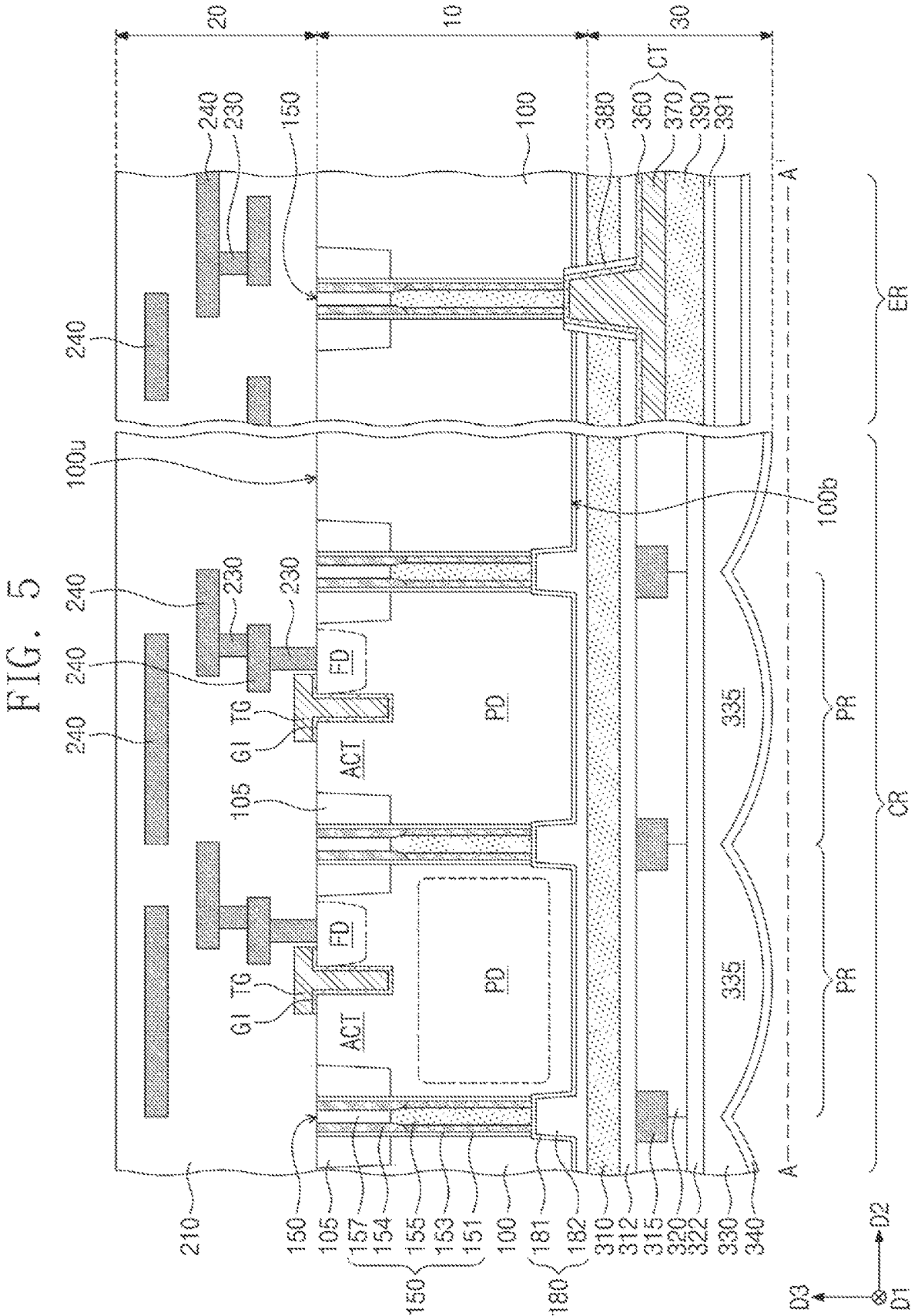
FIG. 5 is a cross-sectional view corresponding to the line A-A' of FIG. 3 and illustrating an image sensor according to one or more embodiments of the disclosure.

FIG. 5 is a cross-sectional view corresponding to the line A-A' of FIG. 3 and illustrating an image sensor according to one or more embodiments of the disclosure. Hereinafter, the descriptions to aspects similar to those as mentioned with reference to FIGS. 1 to 4 may be omitted for the purpose of ease and convenience in explanation.

Referring to FIGS. 3 and 5, the photoelectric conversion layer 10 may further include a back device isolation pattern 180 disposed adjacent to the second surface 100b of the substrate 100. The back device isolation pattern 180 may extend from the second surface 100b into the substrate 100. The back device isolation pattern 180 may be positioned vertically below the deep device isolation pattern 150 (e.g., in the + third direction D3), and the back device isolation pattern 180 may have a horizontal width that is greater than a horizontal width of the deep device isolation pattern 150 (at least in the cross-sectional view). In other words, the back device isolation pattern 180 may contact the semiconductor pattern 153 and the first filling pattern 155 of the deep device isolation pattern 150.

The back device isolation pattern 180 may include a surface dielectric layer 181 and a gap-fill dielectric layer 182. The gap-fill dielectric layer 182 may extend from the second surface 100b into the substrate 100. The surface dielectric layer 181 may be disposed between the gap-fill dielectric layer 182 and the substrate 100. The surface dielectric layer 181 and the gap-fill dielectric layer 182 may include a metal oxide or metal fluoride including at least one metal of hafnium (Hf), zirconium (Zr), aluminum (Al), tantalum (Ta), titanium (Ti), yttrium (Y), and a lanthanoid (La).

Figure 6:
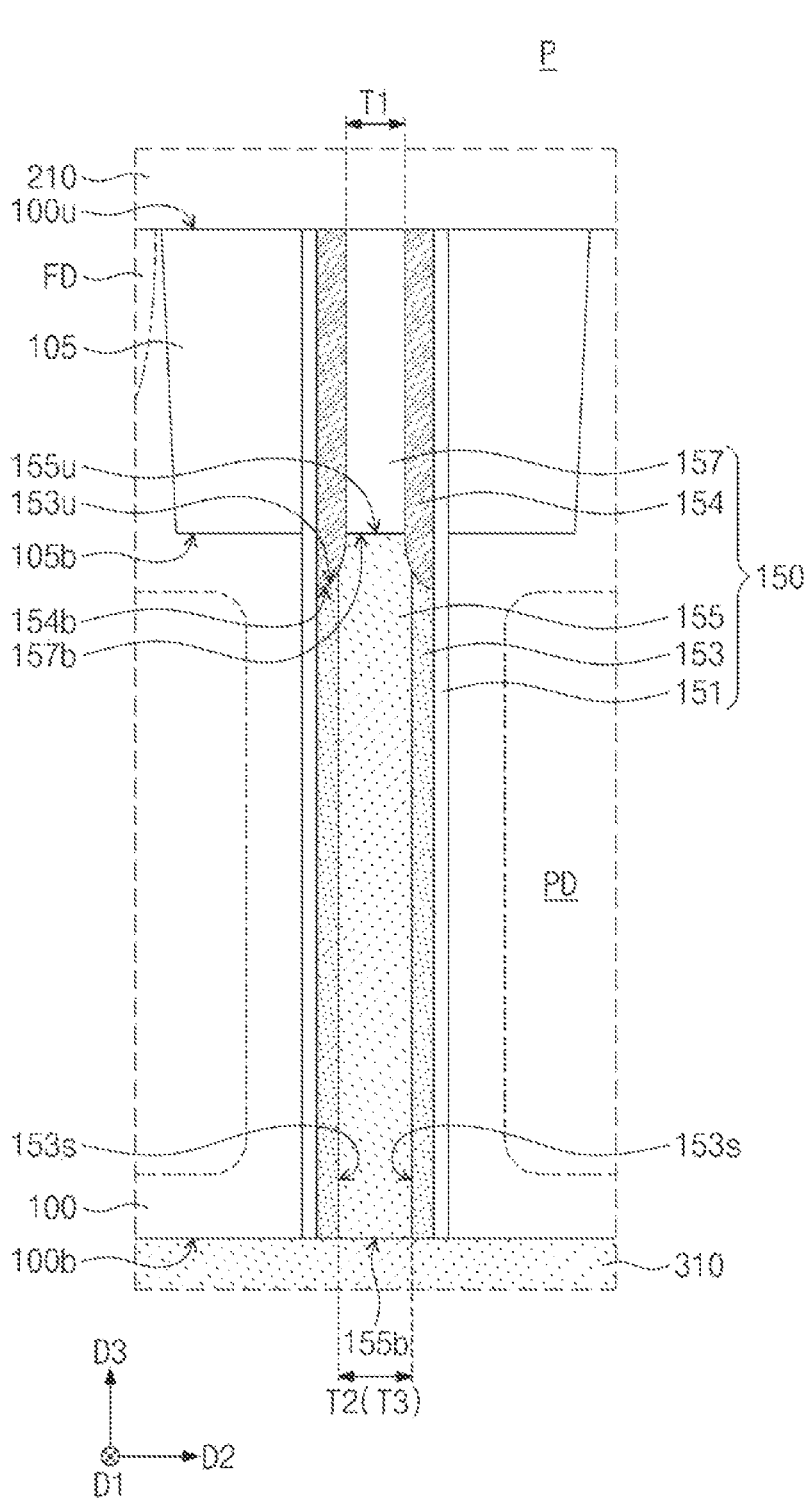
FIGS. 6, 7, 8 and 9 are enlarged views of a portion 'P' of FIG. 4 according to one or more embodiments of the disclosure.

FIG. 6 is an enlarged view of a portion 'P' of FIG. 4 according to one or more embodiments of the disclosure. Referring to FIG. 6, inner side surfaces 153s of the semiconductor pattern 153 may be spaced apart from each other in the second direction D2 with the first filling pattern 155 interposed therebetween. The inner side surfaces 153s of the semiconductor pattern 153 may contact the first filling pattern 155. A distance T3 between the inner side surfaces 153s of the semiconductor pattern 153 may be substantially constant as a height in the third direction D3 increases. In other words, the inner side surfaces 153s of the semiconductor pattern 153 may be spaced apart from each other by the constant distance T3. A top surface 153u of the semiconductor pattern 153 may be lower than a top surface 155u of the first filling pattern 155.

The top surface 155u of the first filling pattern 155 may be located at substantially the same height as a bottom surface 105b of the shallow device isolation pattern 105. A bottom surface 157b of the second filling pattern 157 may be located at substantially the same height as the bottom surface 105b of the shallow device isolation pattern 105. The first filling pattern 155 may have a thickness in the second direction D2. A thickness T1 of the top surface 155u of the first filling pattern 155 may be less than a thickness T2 of a bottom surface 155b of the first filling pattern 155.

At least a portion of the oxidized semiconductor pattern 154 may horizontally overlap the semiconductor pattern 153 (e.g., in the second direction D2). At least a portion of a bottom surface 154*b* of the oxidized semiconductor pattern 154 may contact the top surface 153*u* of the semiconductor pattern 153. The bottom surface 154*b* of the oxidized semiconductor pattern 154 may be lower than the top surface 155*u* of the first filling pattern 155.

Figure 7:
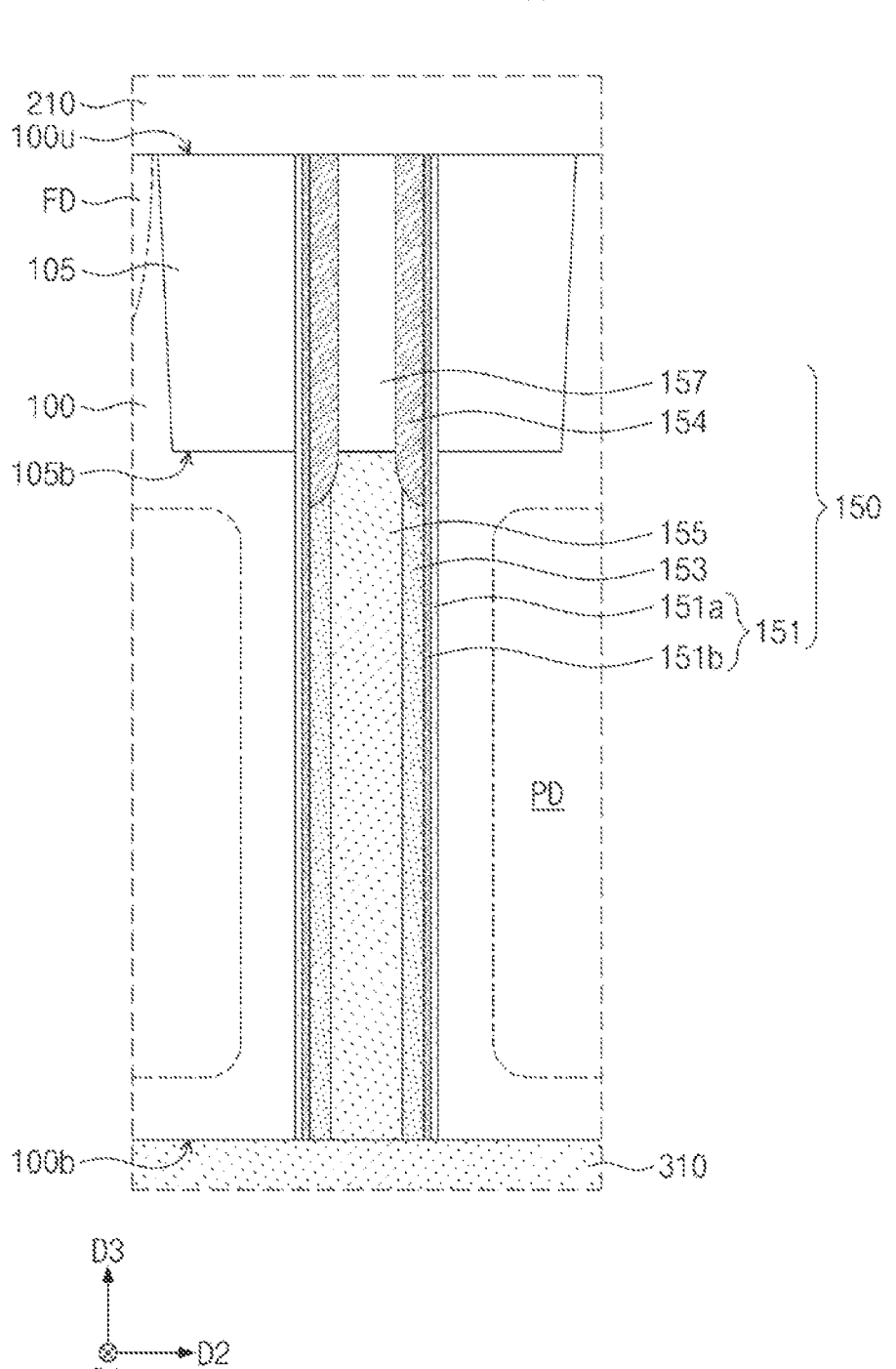
Figure 8:
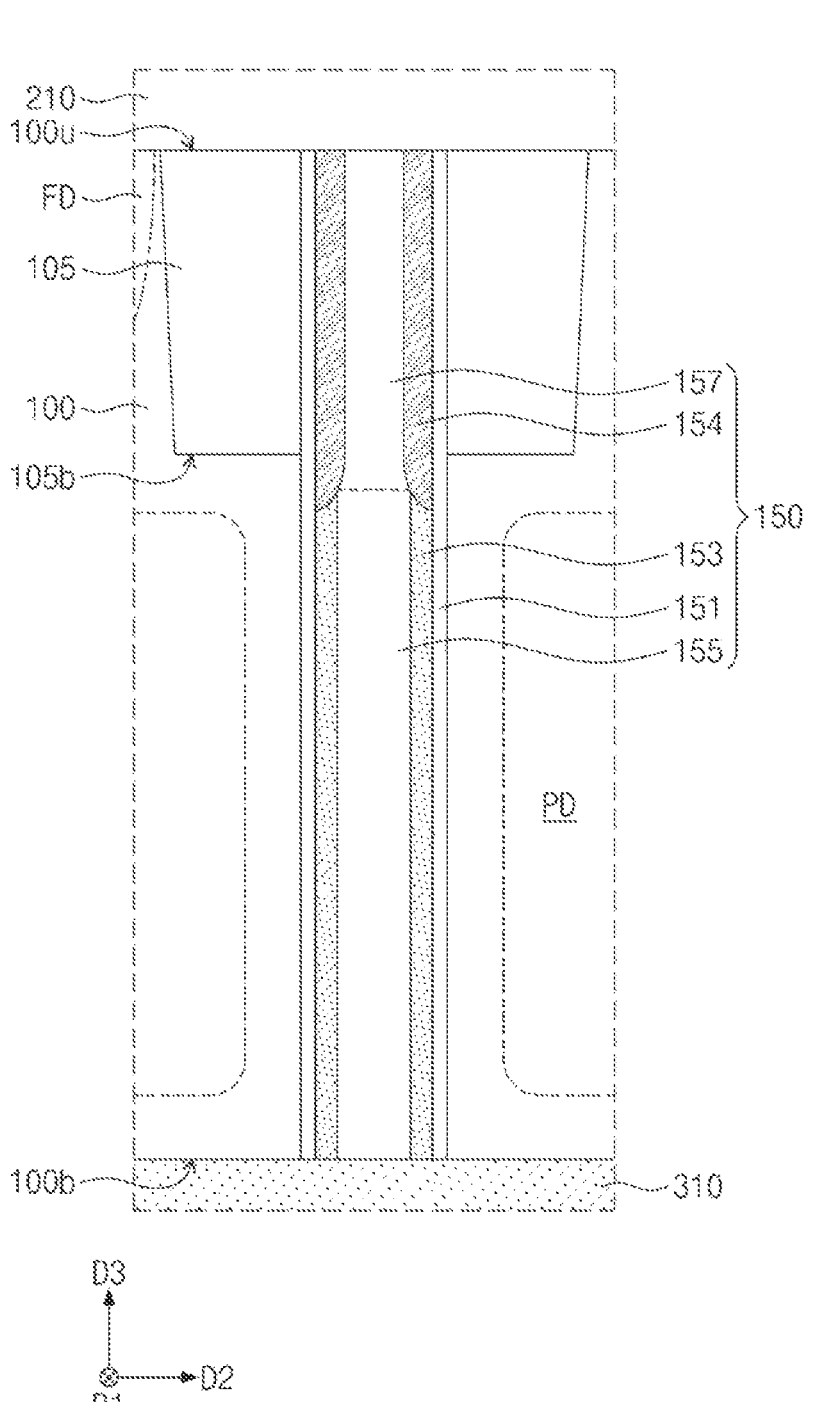
Figure 9:
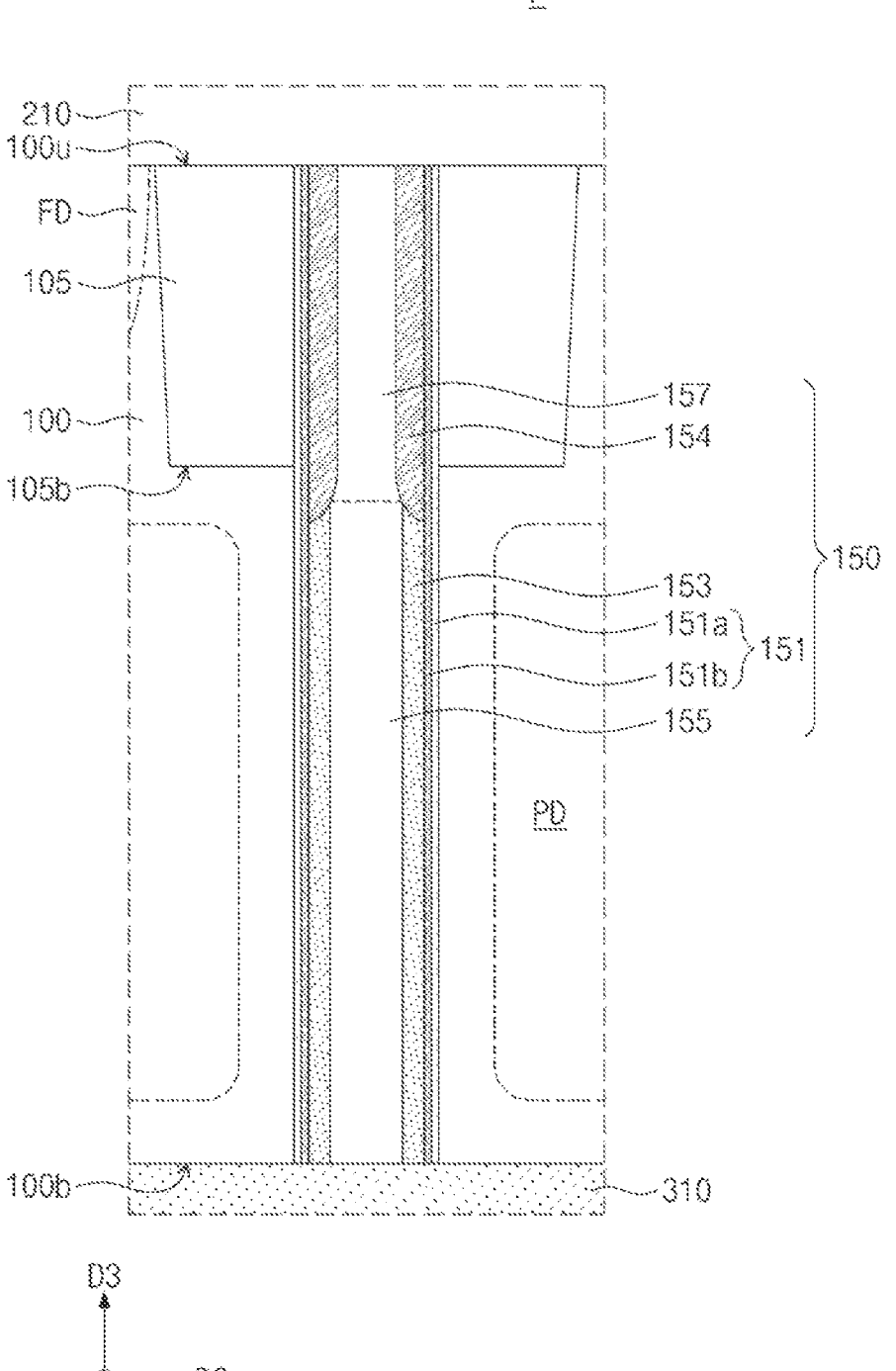

FIGS. 7, 8 and 9 are enlarged views of a portion 'P' of FIG. 4 according to one or more embodiments of the disclosure. Hereinafter, various embodiments of the disclosure will be described with reference to FIGS. 7 to 9. The descriptions to aspects similar to those as mentioned with reference to FIGS. 1 to 6 may be omitted for the purpose of ease and convenience in explanation. That is, FIGS. 7 to 9 show various examples of embodiments of portion 'P' of FIG. 4.

Referring to FIG. 7, the side insulating pattern 151 may include a first side insulating pattern 151*a* and a second side insulating pattern 151*b*. The second side insulating pattern 151*b* may be disposed between the first side insulating pattern 151*a* and the semiconductor pattern 153 and between the first side insulating pattern 151*a* and the oxidized semiconductor pattern 154. The first side insulating pattern 151*a* may be disposed between the second side insulating pattern 151*b* and the substrate 100. The first side insulating pattern 151*a* and the second side insulating pattern 151*b* may include different materials. For example, the first side insulating pattern 151*a* may include silicon oxide, and the second side insulating pattern 151*b* may include silicon nitride.

Referring to FIG. 8, the first filling pattern 155 and the second filling pattern 157 may include the same material. The first filling pattern 155 and the second filling pattern 157 may contact each other without an interface therebetween. For example, the first filling pattern 155 and the second filling pattern 157 may include silicon oxide.

Referring to FIG. 9, the first filling pattern 155 and the second filling pattern 157 may include the same material. The first filling pattern 155 and the second filling pattern 157 may contact each other without an interface therebetween. For example, the first filling pattern 155 and the second filling pattern 157 may include silicon oxide. The side insulating pattern 151 may include a first side insulating pattern 151*a* and a second side insulating pattern 151*b*. The second side insulating pattern 151*b* may be disposed between the first side insulating pattern 151*a* and the semiconductor pattern 153 and between the first side insulating pattern 151*a* and the oxidized semiconductor pattern 154. The first side insulating pattern 151*a* may be disposed between the second side insulating pattern 151*b* and the substrate 100. The first side insulating pattern 151*a* and the second side insulating pattern 151*b* may include different materials. For example, the first side insulating pattern 151*a* may include silicon oxide, and the second side insulating pattern 151*b* may include silicon nitride.

FIGS. 10, 11, 12, 13, 14, 15, 16 and 17 are cross-sectional views corresponding to the line A-A' of FIG. 3 and illustrating a method of manufacturing an image sensor according to one or more embodiments of the disclosure. Hereinafter, the descriptions of aspects similar to those as mentioned with reference to FIGS. 1 to 9 may be omitted for the purpose of ease and convenience in explanation.

Figure 10:
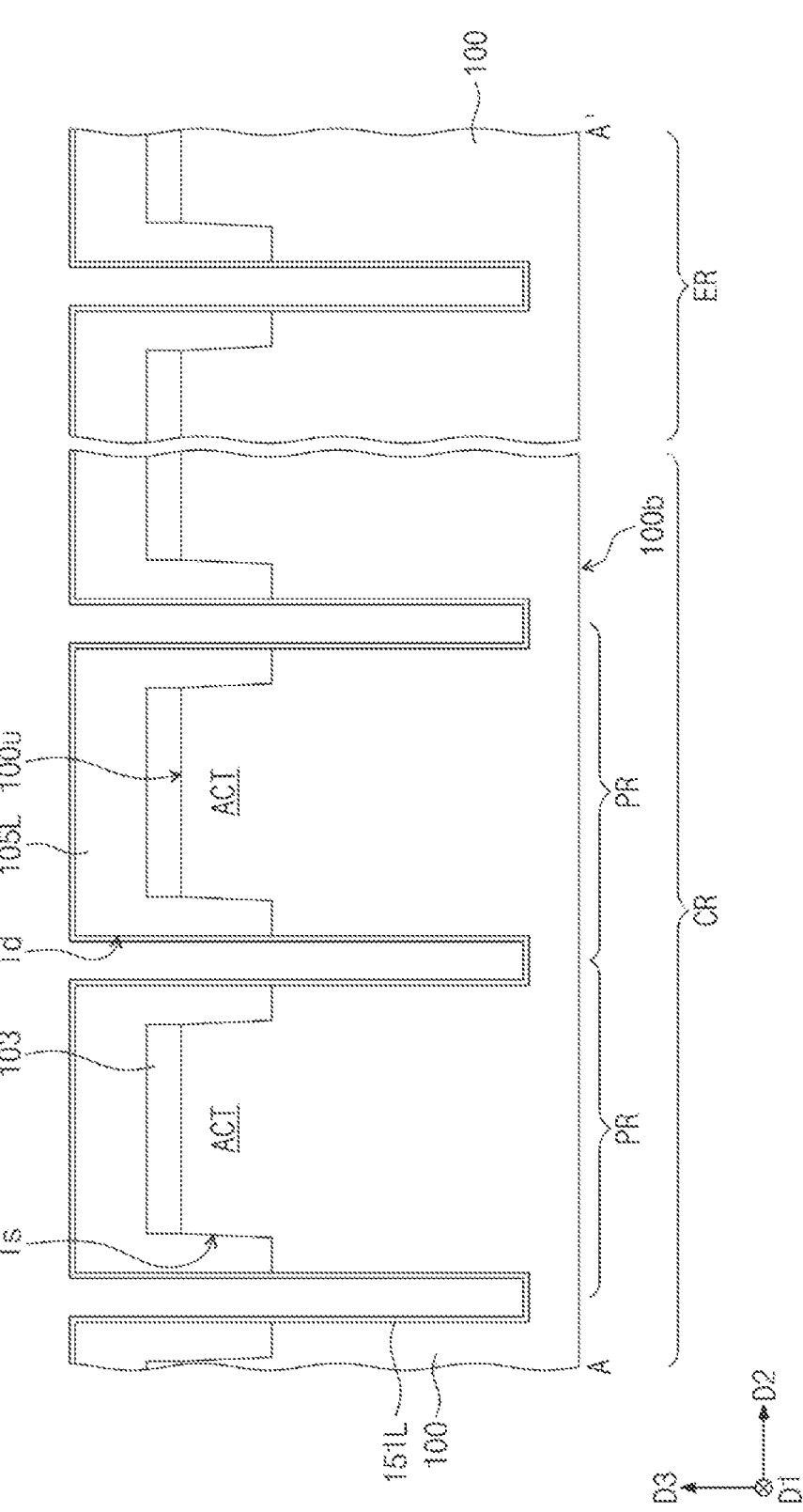

Referring to FIG. 10, a substrate 100 including first and second surfaces 100*u* and 100*b* opposite to each other may be provided. The substrate 100 may include a central region CR and an edge region ER surrounding or at least partially surrounding the central region CR.

A shallow trench Ts may be formed adjacent to the first surface 100*u* and may be formed in the substrate 100. The formation of the shallow trench Ts may include forming a first mask pattern 103 on the first surface 100*u*, and etching the substrate 100 using the first mask pattern 103 as an etch mask. The shallow trench Ts may define an active pattern ACT in the substrate 100.

A device isolation layer 105L may be formed on the first surface 100*a*. The device isolation layer 105L may cover or at least partially cover the first mask pattern 103 and may fill or at least partially fill the shallow trench Ts. For example, the device isolation layer 105L may include a silicon oxide layer, a silicon nitride layer, and/or a silicon oxynitride layer.

A deep trench Td may be formed in the substrate 100 and may extend from the first surface 100*u* into the substrate 100. An aspect ratio of the deep trench Td may range from about 50 to about 300. The formation of the deep trench Td may include forming a second mask pattern defining a region, in which the deep trench Td will be formed, on the device isolation layer 105L, and etching the device isolation layer 105L and the substrate 100 using the second mask pattern as an etch mask. The deep trench Td may define pixel regions PR in the substrate 100. The pixel regions PR may be defined in the central region CR of the substrate 100, and each of the pixel regions PR may include the active pattern ACT defined by the shallow trench Ts.

The deep trench Td may have a shape in which lines extending in a first direction D1 parallel to the first surface 100*u* intersect lines extending in a second direction D2 parallel to the first surface 100*u*, in a plan view. The first direction D1 and the second direction D2 may intersect (e.g., be perpendicular to) each other. The deep trench Td may surround each of the pixel regions PR in a plan view.

A side insulating layer 151L may be formed to cover or at least partially cover an inner surface of the deep trench Td and to extend onto a top surface of the device isolation layer 105L. The side insulating layer 151L may conformally cover the inner surface of the deep trench Td and the top surface of the device isolation layer 105L. The formation of the side insulating layer 151L may be performed using a deposition process (e.g., an atomic layer deposition (ALD) process and/or a low pressure chemical vapor deposition (LPCVD) process) or a thermal oxidation process.

Figure 11:
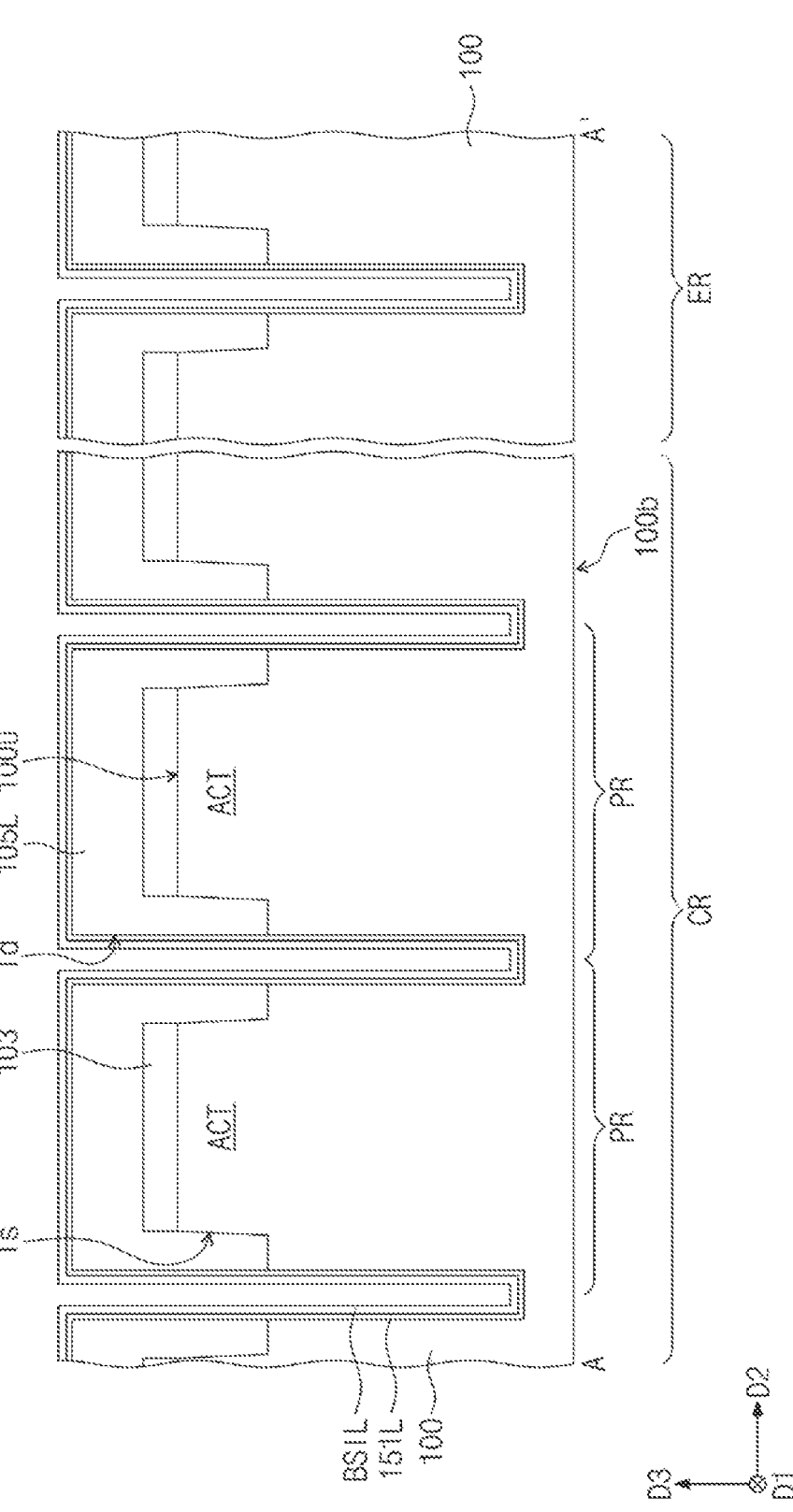

Referring to FIG. 11, a semiconductor layer BSIL may be formed to cover or at least partially cover the side insulating layer 151L. The semiconductor layer BSIL may conformally cover or at least partially cover a top surface of the side insulating layer 151L. The semiconductor layer BSIL may be formed to have a uniform thickness. The semiconductor layer BSIL may include a semiconductor material doped with P-type or N-type dopants. For example, the semiconductor layer BSIL may include poly-silicon doped with boron.

For example, the formation of the semiconductor layer BSIL may include depositing a preliminary semiconductor layer conformally covering the side insulating layer 151L, and performing a process (e.g., an ion implantation process, a plasma doping process, or a gas phase doping process) of injecting P-type or N-type dopants on the preliminary semiconductor layer. Alternatively, the formation of the semiconductor layer BSIL may include performing a process (e.g., a LPCVD process, a plasma enhanced CVD (PECVD) process, or an epitaxial deposition process) of mixing and depositing a semiconductor material and dopants.

Figure 12:
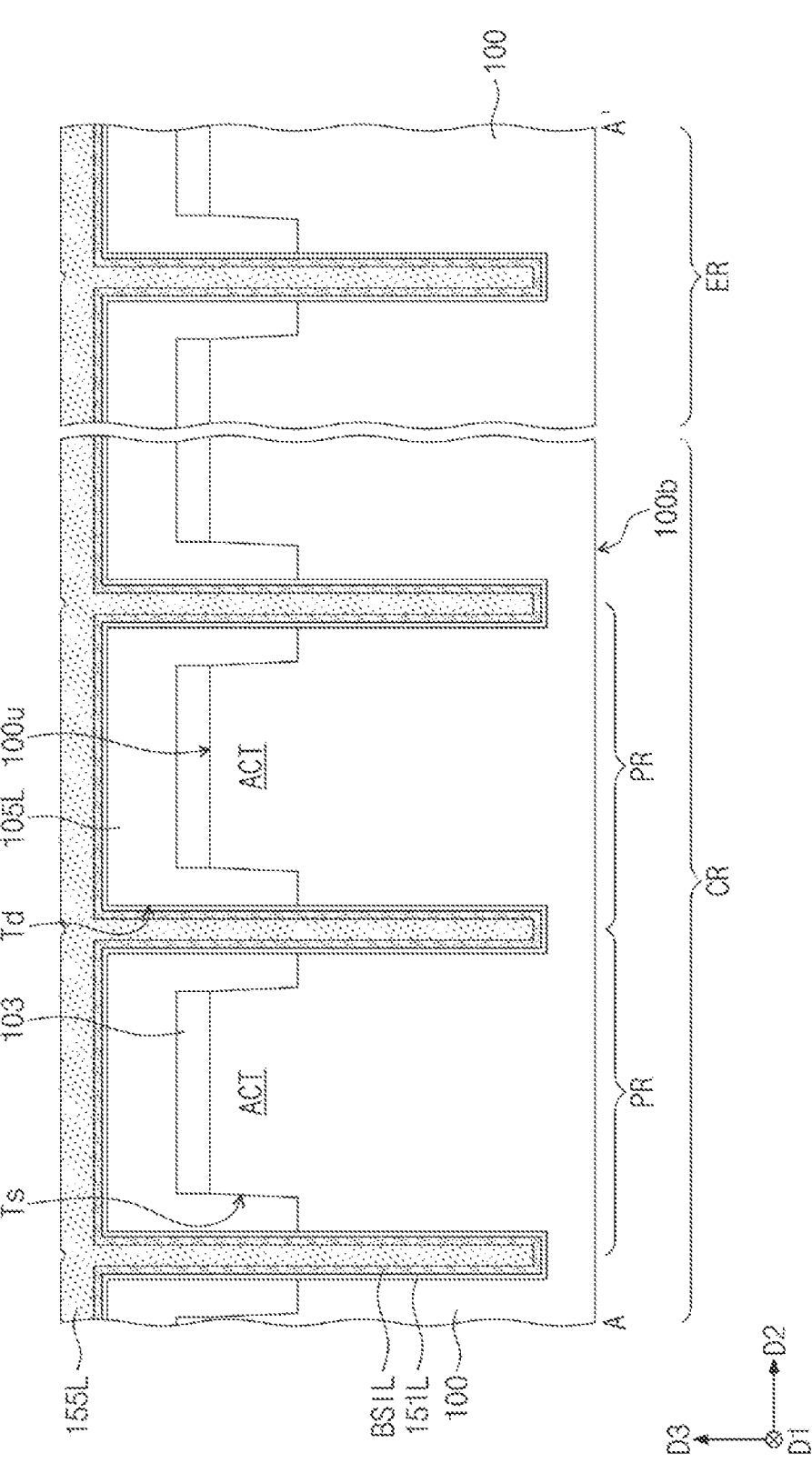

Referring to FIG. 12, a first filling layer 155L may be formed on the semiconductor layer BSIL. The first filling layer 155L may fill or at least partially fill the deep trench Td. The first filling layer 155L may fill or at least partially fill the deep trench Td and may extend in the second direction D2.

Figure 13:
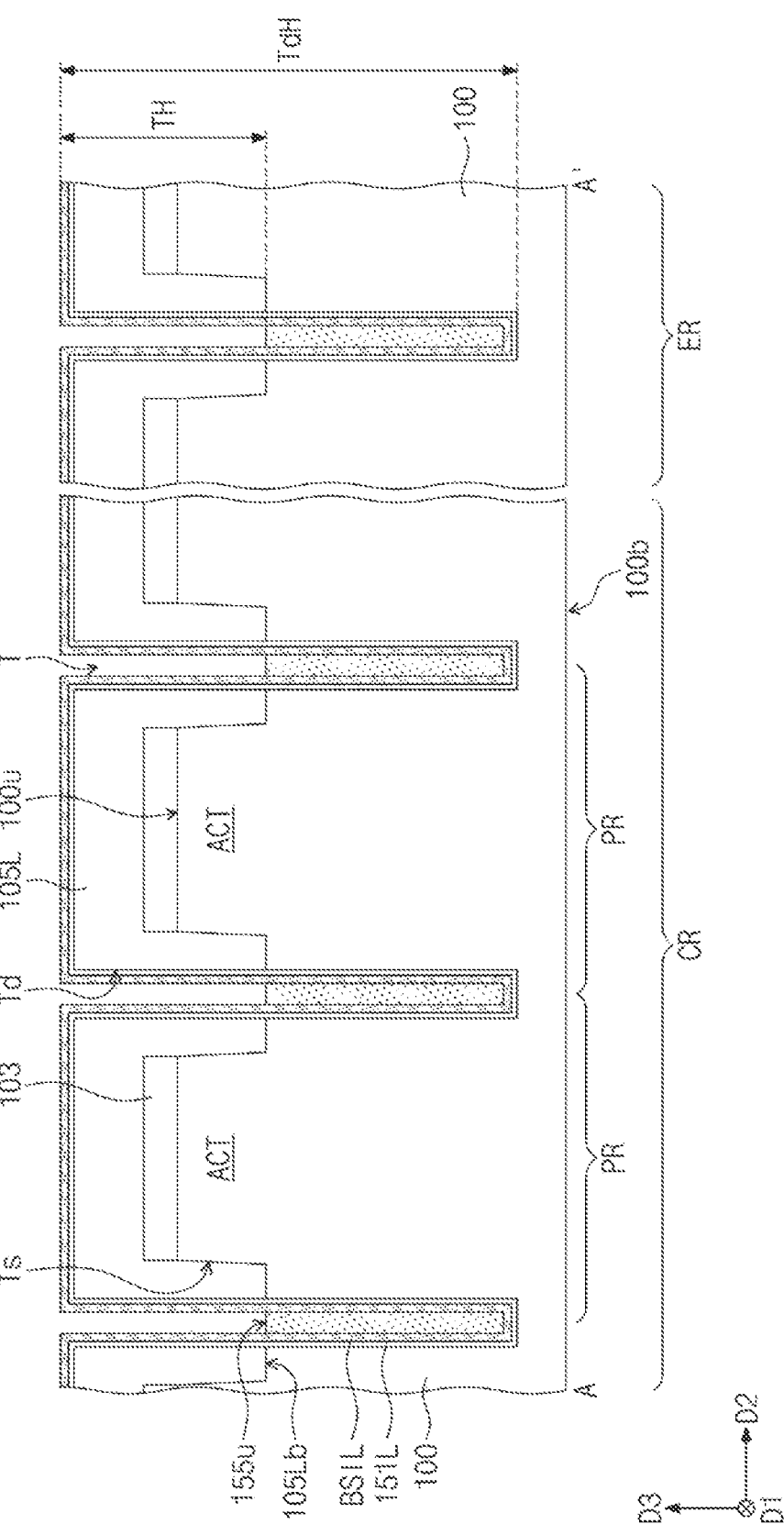

Referring to FIG. 13, a trench, for example, trench T may be formed in the substrate 100. Description herein will be made to the singular trench T shown in the figures, but may apply to multiple trenches that may be formed in the device. The trench T may be a portion of the deep trench Td. The trench T may be formed by performing an etching process on the first filling layer 155L. A depth TH of the trench T may range from about 50% to about 90% of a depth TdH of the deep trench Td. For example, a bottom surface of the trench T may be located at substantially the same height as a bottom surface 105Lb of the device isolation layer 105L. The formation of the trench T may include forming a third mask pattern defining a region, in which the trench T will be formed, on the first filling layer 155L, and etching the first filling layer 155L using the third mask pattern as an etch mask.

A portion of the first filling layer 155L may be removed by the etching process. The first filling layer 155L may remain in a lower portion of the deep trench Td. The remaining portion of the first filling layer 155L may be referred to as a first filling pattern 155. A top surface 155u of the first filling pattern 155 may be located at substantially the same height as the bottom surface 105Lb of the device isolation layer 105L.

A portion of the semiconductor layer BSIL may be exposed by the trench T. A remaining portion of the semiconductor layer BSIL may contact the first filling pattern 155 and thus may not be exposed.

Figure 14:
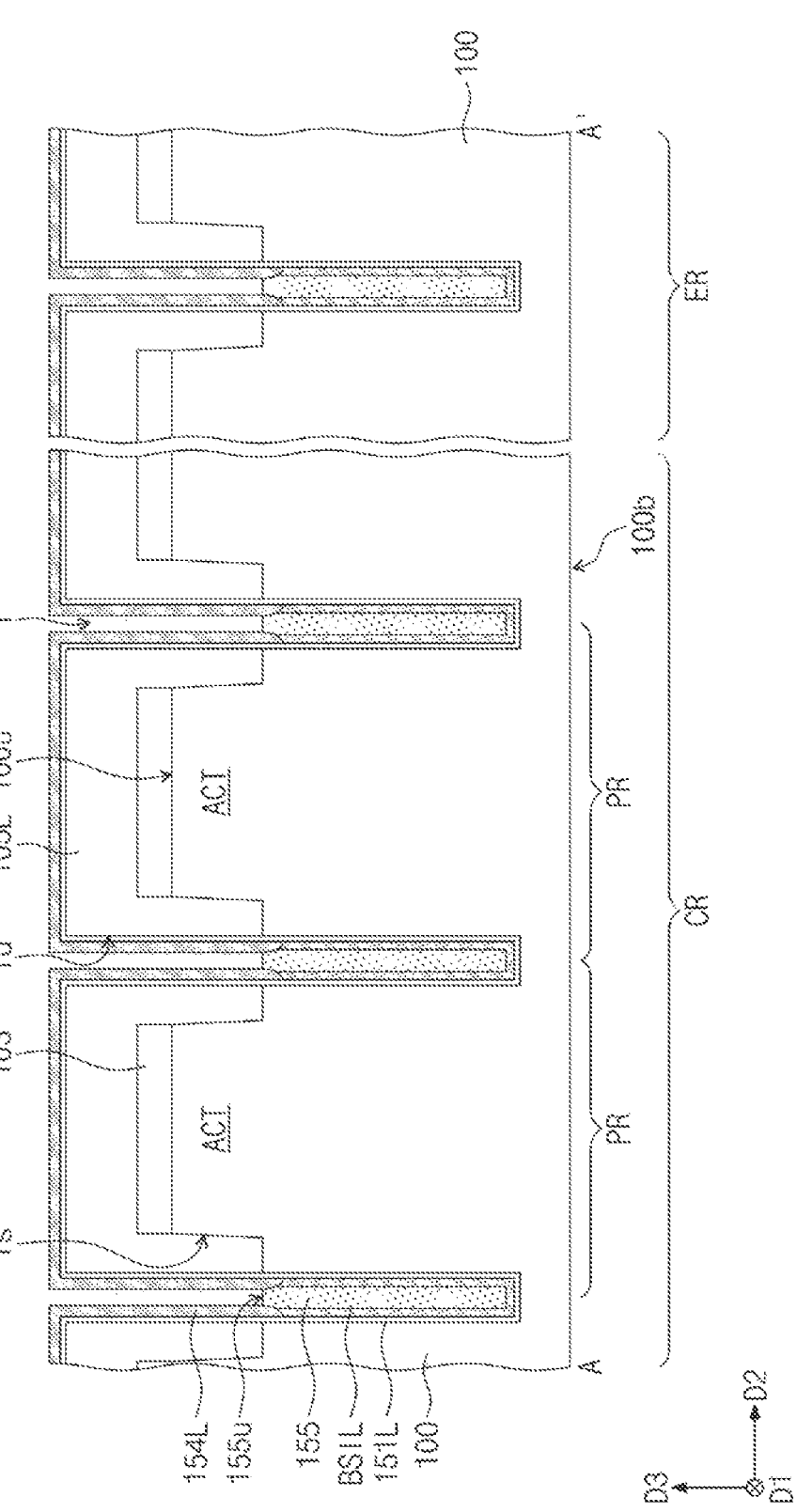

Referring to FIG. 14, an oxidized semiconductor layer 154L may be formed by oxidizing the portion of the semiconductor layer BSIL, which is exposed by the trench T. The remaining portion of the semiconductor layer BSIL may not be oxidized.

Figure 15:
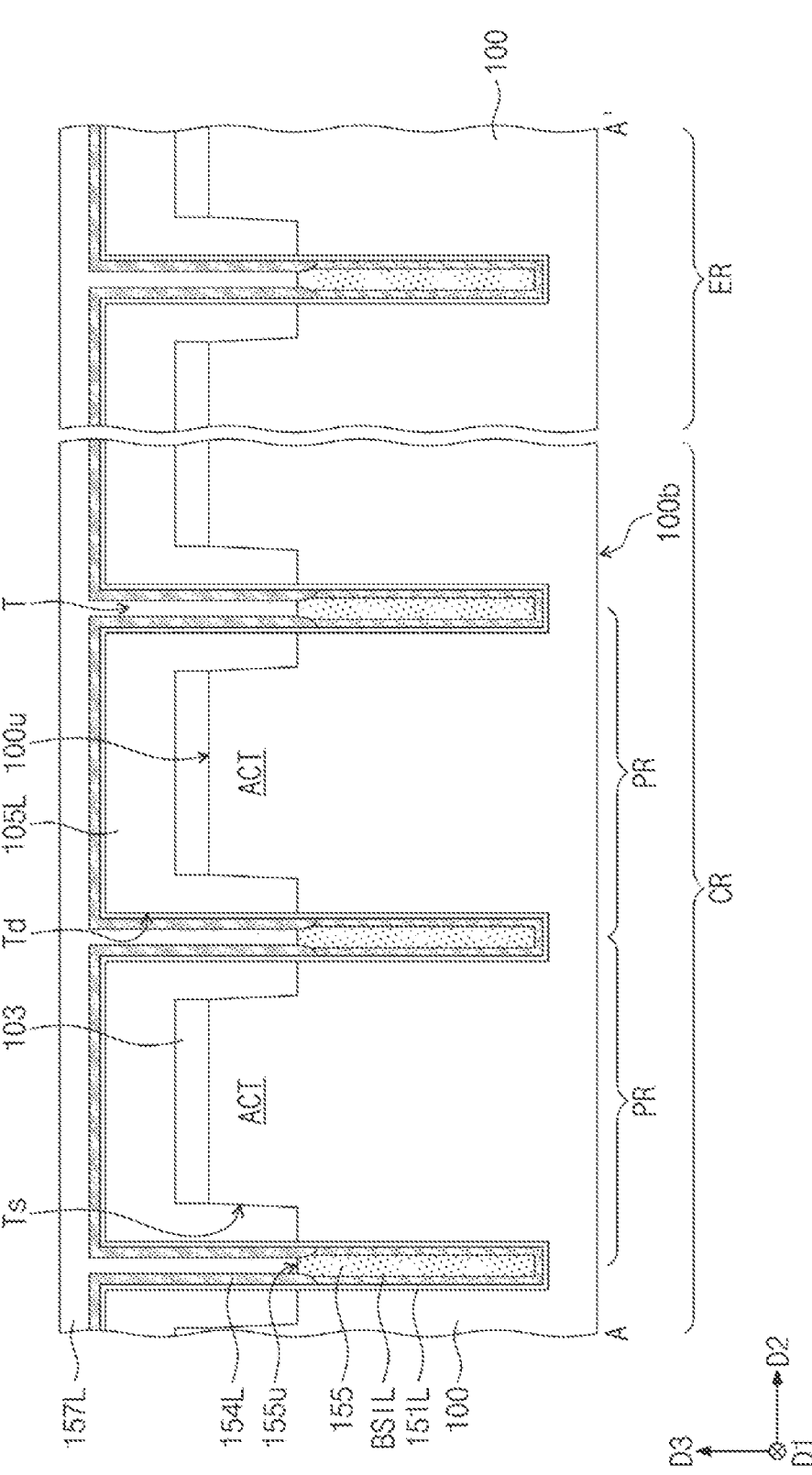

Referring to FIG. 15, a second filling layer 157L may be formed to fill or at least partially fill the trench T. The second filling layer 157L may fill or at least partially fill the trench T on the first filling pattern 155 and may extend in the second direction D2. For example, the second filling layer 157L may include silicon oxide.

Figure 16:
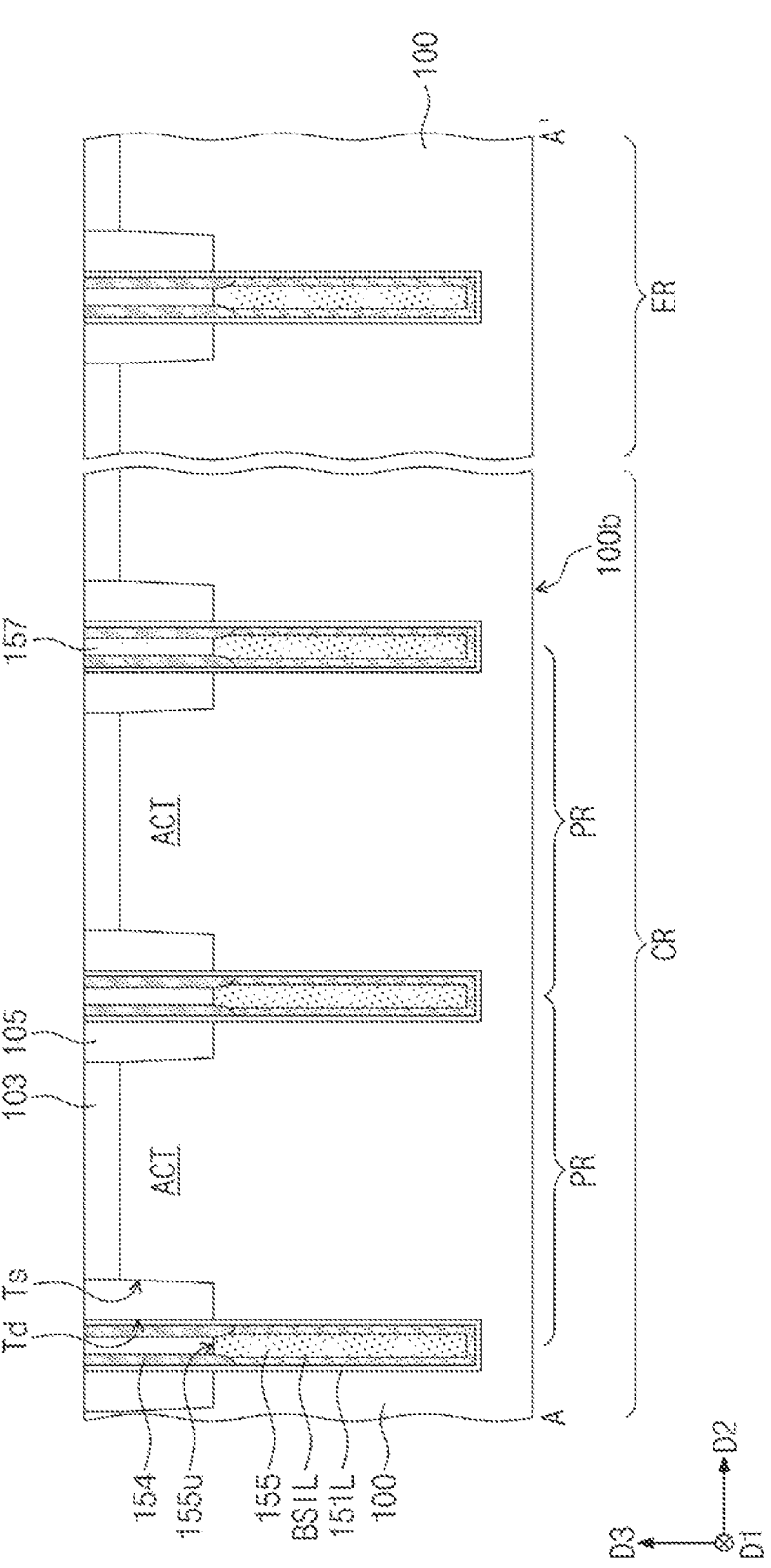

Referring to FIG. 16, a planarization process may be performed on the second filling layer 157L. Upper portions of the second filling layer 157L, the oxidized semiconductor layer 154L, the side insulating layer 151L and the device isolation layer 105L may be removed by the planarization process. The first mask pattern 103 may be exposed to the outside by the planarization process. The upper portion of the device isolation layer 105L may be removed to form a shallow device isolation pattern 105.

The upper portion of the oxidized semiconductor layer 154L may be removed by the planarization process, thereby forming an oxidized semiconductor pattern 154. The upper portion of the second filling layer 157L may be removed by the planarization process, thereby forming a second filling pattern 157.

Figure 17:
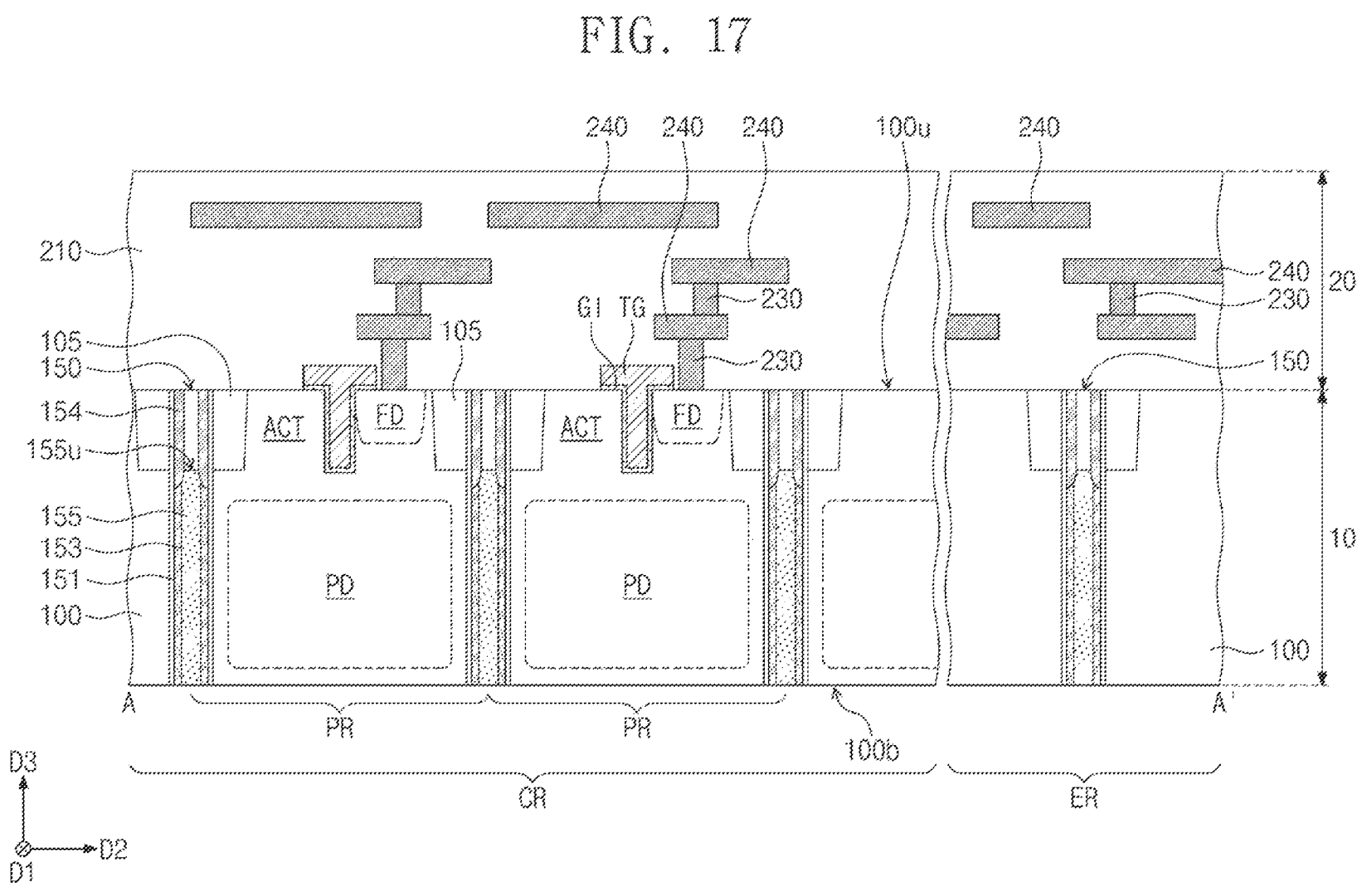

Referring to FIG. 17, a thinning process may be performed on the second surface 100b. A portion of the substrate 100 may be removed by the thinning process. A deep device isolation pattern 150 may be formed by the thinning process, and the deep device isolation pattern 150 may include a side insulating pattern 151, a semiconductor pattern 153, the oxidized semiconductor pattern 154, the first filling pattern 155, and the second filling pattern 157. A lower portion of the side insulating layer 151L may be removed by the thinning process, thereby forming the side insulating pattern 151. A lower portion of the remaining portion of the semiconductor layer BSIL may be removed by the thinning process, thereby forming the semiconductor pattern 153.

For example, the thinning process may include grinding or polishing the second surface 100b of the substrate 100, and anisotropically and/or isotropically etching the ground or polished second surface 100b of the substrate 100.

The first mask pattern 103 may be removed. For example, the removal of the first mask pattern 103 may include etching the first mask pattern 103. Thereafter, an upper portion of the side insulating pattern 151, an upper portion of the second filling pattern 157 and an upper portion of the shallow device isolation pattern 105 may be further removed, and a top surface of the side insulating pattern 151, a top surface of the second filling pattern 157 and a top surface of the shallow device isolation pattern 105 may be substantially coplanar with the first surface 100u.

A photoelectric conversion region PD may be formed in each of the pixel regions PR. For example, the formation of the photoelectric conversion region PD may include injecting dopants having the second conductivity type (e.g., an N-type) different from the first conductivity type (e.g., a P-type) into the substrate 100.

A transfer gate electrode TG and a floating diffusion region FD may be formed on the first surface 100u of the substrate 100 in each of the pixel regions PR. For example, the transfer gate electrode TG and the floating diffusion region FD may be formed on the active pattern ACT of each of the pixel regions PR. A gate dielectric layer GI may be formed between the transfer gate electrode TG and the active pattern ACT.

A photoelectric conversion layer 10 may be formed by the aforementioned manufacturing process, and an interconnection layer 20 may be formed on the first surface 100u. For example, the interconnection layer 20 may include an interlayer insulating layer 210, and the interlayer insulating layer 210 may be formed on the first surface 100u. The interlayer insulating layer 210 may be formed to cover or at least partially cover the first surface 100u, the top surface of the deep device isolation pattern 150 and the top surface of the shallow device isolation pattern 105. The interconnection layer 20 may further include contact plugs 230 and conductive lines 240, and the contact plugs 230 and the conductive lines 240 may be electrically connected to the photoelectric conversion layer 10.

Referring again to FIG. 4, a light transmitting layer 30 may be formed on the second surface 100b. For example, an anti-reflection layer 310 and a first insulating layer 312 may be formed on the second surface 100b. The anti-reflection layer 310 and the first insulating layer 312 may be positioned vertically below the deep device isolation pattern 150 in the + third direction D3. A horizontal width of the anti-reflection layer 310 and the first insulating layer 312 may be greater than a horizontal width of the deep device isolation pattern 150 (at least in the cross-sectional view). The anti-reflection layer 310 and the first insulating layer 312 on the edge region ER may be etched to form a hole exposing the semiconductor pattern 153, a contact insulating layer 380 may be formed to cover or at least partially cover an inner side surface of the hole, and then, a contact pattern CT may be formed to fill or at least partially fill a remaining portion of the hole. The contact pattern CT may include a barrier pattern 360 and a metal pattern 370.

The formation of the contact pattern CT may include forming a barrier layer conformally covering an inner surface of the hole, forming a contact metal layer on the barrier layer, and etching the barrier layer and the contact metal layer to form the barrier pattern 360 and the metal pattern 370, respectively.

A grid 315 may be formed on the first insulating layer 312 and may be positioned vertically below the deep device isolation pattern 150 in the + third direction D3 (the horizontal width of the grid 315 may be greater than the horizontal width of the deep device isolation pattern 150, at least in the cross-sectional view). For example, the formation of the grid 315 may include depositing a metal layer on the first insulating layer 312, and patterning the metal layer.

A color filter array 320 may be formed on the first insulating layer 312 to cover or at least partially cover the grid 315. The color filter array 320 may include a plurality of color filters 320, and the plurality of color filters 320 may be disposed on the pixel regions PR, respectively. A second insulating layer 322 may be formed on the color filter array 320, and a micro lens array 330 may be formed on the second insulating layer 322. The micro lens array 330 may include micro lenses disposed on the plurality of color filters 320.

Figure 18:
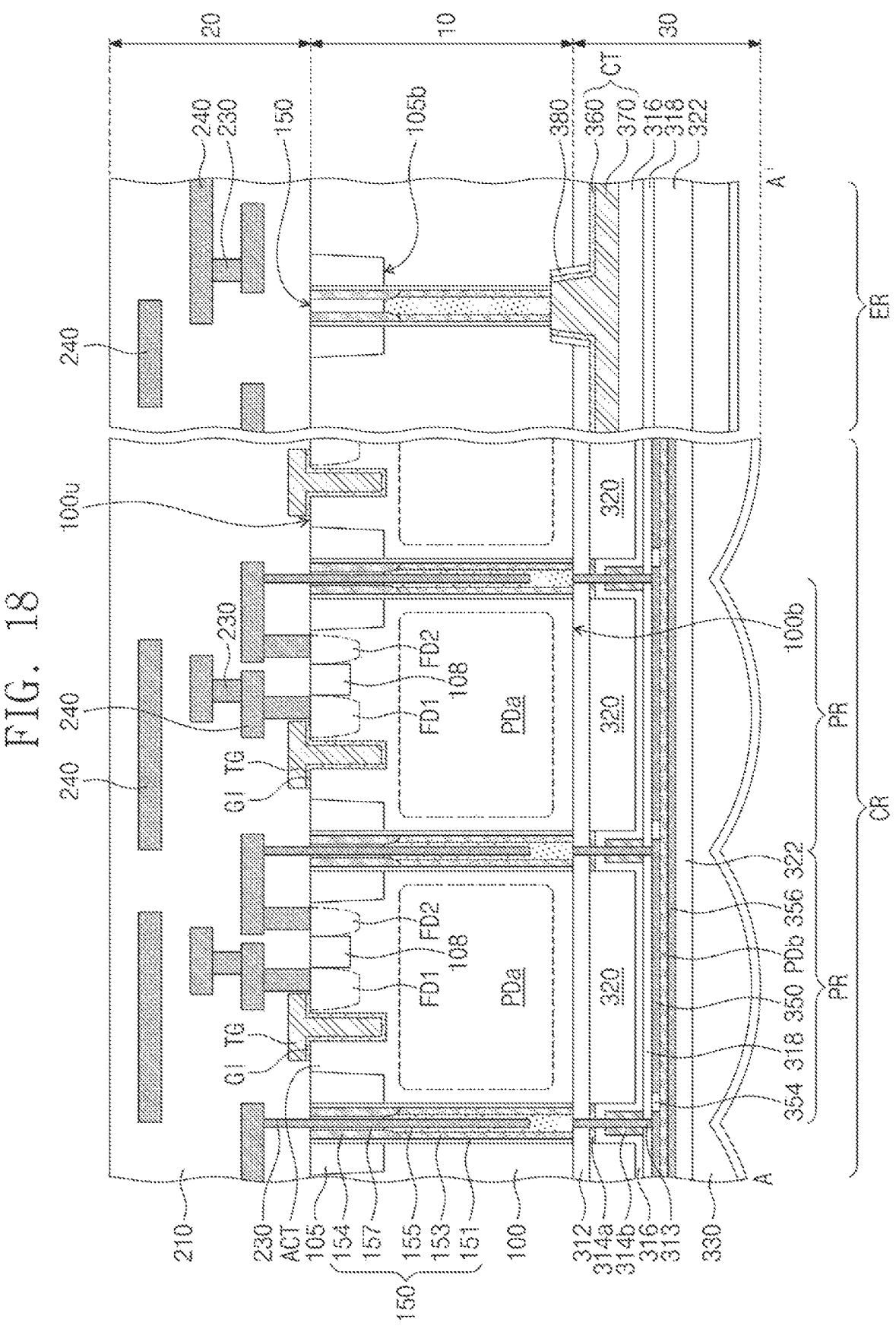
FIG. 18 is a cross-sectional view corresponding to the line A-A' of FIG. 3 and illustrating an image sensor according to one or more embodiments of the disclosure.

FIG. 18 is a cross-sectional view corresponding to the line A-A' of FIG. 3 and illustrating an image sensor according to one or more embodiments of the disclosure. Hereinafter, the descriptions of aspects similar to those as mentioned with reference to FIGS. 1 to 6 may be omitted for the purpose of ease and convenience in explanation.

Referring to FIG. 18, a separation insulating pattern 108 may be disposed adjacent to the first surface 100u and may be disposed in the active pattern ACT of each of the pixel regions PR. For example, the separation insulating pattern 108 may include silicon oxide, silicon nitride, and/or silicon oxynitride.

A transfer gate electrode TG and a first floating diffusion region FD1 may be disposed on the first surface 100u and on the active pattern ACT of each of the pixel regions PR. The transfer gate electrode TG and the first floating diffusion region FD1 may constitute the transfer transistor TX of FIG. 2. A second floating diffusion region FD2 may be disposed on the first surface 100u and on the active pattern ACT of each of the pixel regions PR. The separation insulating pattern 108 may be disposed between the first floating diffusion region FD1 and the second floating diffusion region FD2. The first and second floating diffusion regions FD1 and FD2 may be regions doped with dopants (e.g., N-type dopants) having the second conductivity type different from the first conductivity type of the substrate 100.

The second floating diffusion region FD2 may be connected to a corresponding one of the contact plugs 230 in the interconnection layer 20. The first filling pattern 155 of the deep device isolation pattern 150 may be connected to a corresponding one of the contact plugs 230 in the interconnection layer 20. The first filling pattern 155 may be electrically connected to the second floating diffusion region FD2 through the corresponding contact plugs 230 and a corresponding one of the conductive lines 240.

Each of the pixel regions PR may include a first photoelectric conversion region PDa. The first photoelectric conversion region PDa may be a region doped with dopants (e.g., N-type dopants) having the second conductivity type different from the first conductivity type of the substrate 100. The first photoelectric conversion region PDa may form a PN junction with the substrate 100 to form a photodiode.

A light transmitting layer 30 may be disposed on the second surface 100b of the substrate 100. The light transmitting layer 30 may include a color filter array 320 and a micro lens array 330, which are disposed on the second surface 100b. The color filter array 320 may be disposed between the second surface 100b of the substrate 100 and the micro lens array 330. The color filter array 320 may include a plurality of color filters 320 disposed on the pixel regions PR, respectively, and the micro lens array 330 may include micro lenses disposed on the plurality of color filters 320, respectively.

A first insulating layer 312 may be disposed between the second surface 100b of the substrate 100 and the color filter array 320. Light blocking patterns 314a may be disposed on the first insulating layer 312 between the plurality of color filters 320. Low-refractive index patterns 314b may be disposed between the plurality of color filters 320 and may be disposed on the light blocking patterns 314a, respectively. A third insulating layer 316 may be disposed between each of the light blocking patterns 314a and each of the low-refractive index patterns 314b and may extend between each of the plurality of color filters 320 and each of the low-refractive index patterns 314b. The third insulating layer 316 may extend between each of the plurality of color filters 320 and the micro lens array 330 and may extend onto the contact pattern CT.

Pixel electrodes 350 may be disposed on the pixel regions PR, respectively. The pixel electrodes 350 may be disposed on the plurality of color filters 320, respectively, and the third insulating layer 316 may be disposed between the pixel electrodes 350 and the plurality of color filters 320. Electrode separation patterns 354 may be disposed between the pixel electrodes 350. A fourth insulating layer 318 may be disposed between the pixel electrodes 350 and the third insulating layer 316 and may extend between the electrode separation patterns 354 and the low-refractive index patterns 314b.

A second photoelectric conversion layer PDb may be disposed on the pixel electrodes 350 and the electrode separation patterns 354, and a common electrode 356 may be disposed on the second photoelectric conversion layer PDb. The second photoelectric conversion layer PDb may be disposed between the common electrode 356 and the pixel electrodes 350, as well as between the common electrode 356 and the electrode separation patterns 354. The pixel electrodes 350, the electrode separation patterns 354, the second photoelectric conversion layer PDb and the common electrode 356 may be disposed between the color filter array 320 and the micro lens array 330. For example, the second photoelectric conversion layer PDb may be an organic photoelectric conversion layer. The second photoelectric conversion layer PDb may include a P-type organic semiconductor material and an N-type organic semiconductor material. The P-type organic semiconductor material and the N-type organic semiconductor material may form a PN junction. Alternatively, the second photoelectric conversion layer PDb may include quantum dots or a chalcogenide material. For example, the pixel electrodes 350 and the common electrode 356 may include indium tin oxide (ITO), indium zinc oxide (IZO), zinc oxide (ZnO), and/or an organic transparent conductive material.

Each of the pixel electrodes 350 may be electrically connected to the first filling pattern 155 of the deep device isolation pattern 150 through a via plug 313. The via plug 313 may be connected to the first filling pattern 155 and may penetrate the first insulating layer 312, a corresponding light blocking pattern 314a, the third insulating layer 316, a corresponding low-refractive index pattern 314b and the fourth insulating layer 318 so as to be connected to a corresponding one of the pixel electrodes 350.

A second insulating layer 322 may be disposed between the common electrode 356 and the micro lens array 330. For example, the first to fourth insulating layers 312, 322, 316, and 318 and the electrode separation patterns 354 may include a silicon oxide layer, a silicon nitride layer, and/or a silicon oxynitride layer.

Figure 19:
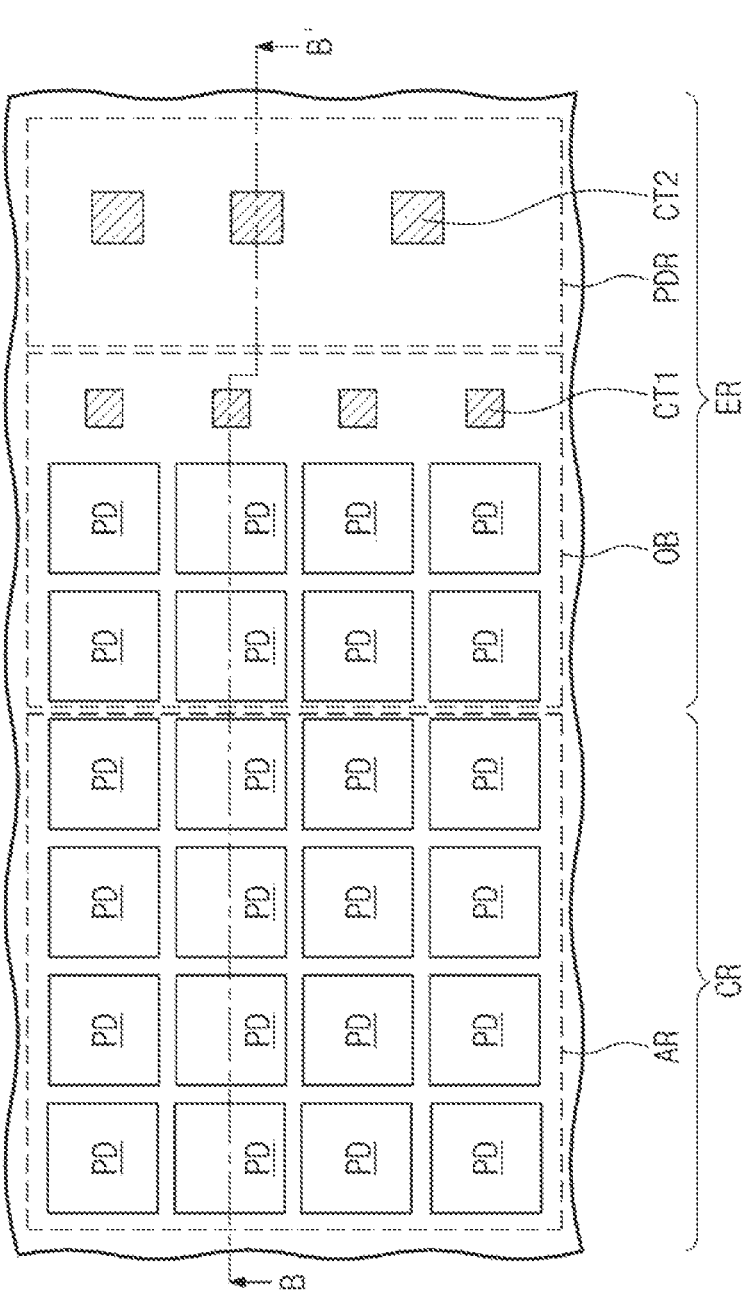
FIG. 19 is a plan view illustrating an image sensor according to one or more embodiments of the disclosure.
Figure 20:
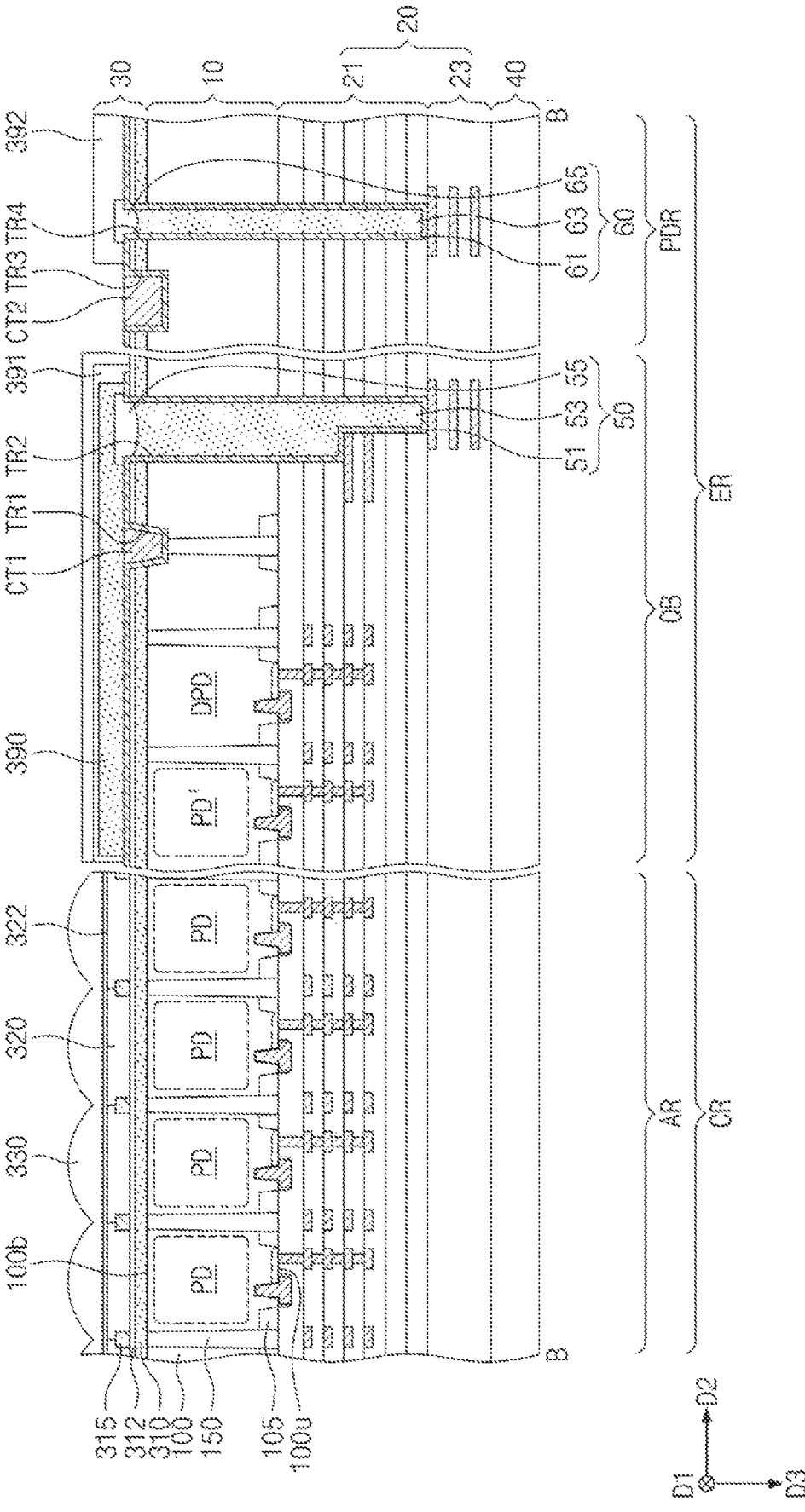
FIG. 20 is a cross-sectional view corresponding to a line B-B' of FIG. 19 according to one or more embodiments of the disclosure.

FIG. 19 is a plan view illustrating an image sensor according to one or more embodiments of the disclosure. FIG. 20 is a cross-sectional view corresponding to a line B-B' of FIG. 19 according to one or more embodiments of the disclosure. Hereinafter, the descriptions of similar aspects as mentioned with reference to FIGS. 1 to 6 may be omitted for the purpose of ease and convenience in explanation.

Referring to FIGS. 19 and 20, an image sensor may include a substrate 100 including a pixel array region AR, an optical black region OB and a pad region PDR, an interconnection layer 20 on a first surface 100u of the substrate 100, a base substrate 40 on the interconnection layer 20, and a light transmitting layer 30 on a second surface 100b of the substrate 100. The central region CR of FIG. 4 may include the pixel array region AR, and the edge region ER of FIG. 4 may include the optical black region OB and the pad region PDR.

The interconnection layer 20 may be disposed between the first surface 100u and the base substrate 40. The interconnection layer 20 may include an upper interconnection layer 21 adjacent to the first surface 100u, and a lower interconnection layer 23 between the upper interconnection layer 21 and the base substrate 40. The pixel array region AR may include a plurality of pixel regions PR and a deep device isolation pattern 150 disposed between the pixel regions PR. The pixel array region AR may further include an anti-reflection layer 310 and a first insulating layer 312, which are disposed on the second surface 100b. The anti-reflection layer 310 and the first insulating layer 312 may be disposed between the second surface 100b and a grid 315.

A first connection structure 50, a first contact CT1 and a bulk color filter 390 may be disposed on the optical black region OB of the substrate 100. The first connection structure 50 may include a first light blocking pattern 51, a first separation pattern 53, and a first capping pattern 55. The first light blocking pattern 51 may be disposed on the second surface 100b. The first light blocking pattern 51 may cover or at least partially cover the first insulating layer 312 and may conformally cover an inner surface of each of a first trench TR1 and a second trench TR2. The first light blocking pattern 51 may penetrate a photoelectric conversion layer 10 and the upper interconnection layer 21. The first light blocking pattern 51 may be connected to the semiconductor pattern 153 of the deep device isolation pattern 150 of the photoelectric conversion layer 10 and may be connected to interconnection lines in the upper interconnection layer 21 and the lower interconnection layer 23. Thus, the first connection structure 50 may electrically connect the photoelectric conversion layer 10 and the interconnection layer 20. The first light blocking pattern 51 may include a metal material (e.g., tungsten). The first light blocking pattern 51 may block light incident to the optical black region OB.

The first contact CT1 may be substantially the same as the contact pattern CT of FIG. 4. The first contact CT1 may fill or at least partially fill a remaining portion of the first trench TR1. The first contact CT1 may include a metal material (e.g., aluminum). The first contact CT1 may be connected to the semiconductor pattern 153 of the deep device isolation pattern 150. A bias may be applied to the semiconductor pattern 153 through the first contact CT1. The first separation pattern 53 may fill or at least partially fill a remaining portion of the second trench TR2. The first separation pattern 53 may penetrate the photoelectric conversion layer 10 and may penetrate a portion of the interconnection layer 20. The first separation pattern 53 may include an insulating material. The first capping pattern 55 may be disposed on the first separation pattern 53. The first capping pattern 55 may include the same material as the second filling pattern 157 of the deep device isolation pattern 150.

The bulk color filter 390 may be disposed on the first connection structure 50 and the first contact CT1. The bulk color filter 390 may cover or at least partially cover the first connection structure 50 and the first contact CT1. A first protective layer 391 may be disposed on the bulk color filter 390 to seal or encapsulate the bulk color filter 390.

An additional photoelectric conversion region PD' and a dummy region DPD may be provided in corresponding pixel regions PR of the optical black region OB. The additional photoelectric conversion region PD' may be a region doped with dopants (e.g., N-type dopants) having the second conductivity type different from the first conductivity type of the substrate 100. The additional photoelectric conversion region PD' may have a structure similar to those of the photoelectric conversion regions PD in the plurality of pixel regions PR of the pixel array region AR but may not perform the same operation (i.e., an operation of receiving light to generate an electrical signal) as the photoelectric conversion regions PD. The dummy region DPD may not be doped with dopants.

A second connection structure 60, a second contact CT2 and a second protective layer 392 may be disposed on the pad region PDR of the substrate 100. The second connection structure 60 may include a second light blocking pattern 61, a second separation pattern 63, and a second capping pattern 65.

The second light blocking pattern 61 may be disposed on the second surface 100b. The second light blocking pattern 61 may cover or at least partially cover the first insulating layer 312 and may conformally cover an inner surface of each of a third trench TR3 and a fourth trench TR4. The second light blocking pattern 61 may penetrate the photoelectric conversion layer 10 and the upper interconnection layer 21. The second light blocking pattern 61 may be connected to interconnection lines provided in the lower interconnection layer 23. Thus, the second connection structure 60 may electrically connect the photoelectric conversion layer 10 and the interconnection layer 20. The second light blocking pattern 61 may include a metal material (e.g., tungsten). The second light blocking pattern 61 may block light incident to the pad region PDR.

The second contact CT2 may fill or at least partially fill a remaining portion of the third trench TR3. The second contact CT2 may include a metal material (e.g., aluminum). The second contact CT2 may function as an electrical connection path between the image sensor and an external device. The second separation pattern 63 may fill or at least partially fill a remaining portion of the fourth trench TR4. The second separation pattern 63 may penetrate the photoelectric conversion layer 10 and may penetrate a portion of the interconnection layer 20. The second separation pattern 63 may include an insulating material. The second capping pattern 65 may be disposed on the second separation pattern 63. The second capping pattern 65 may include the same material as the second filling pattern 157 of the deep device isolation pattern 150. The second protective layer 392 may cover or at least partially cover the second connection structure 60.

A current applied through the second contact CT2 may flow to the semiconductor pattern 153 of the deep device isolation pattern 150 through the second light blocking pattern 61, the interconnection lines in the interconnection layer 20 and the first light blocking pattern 51. Electrical signals generated from the photoelectric conversion regions PD in the pixel regions PR of the pixel array region AR may be transmitted to the external device through the interconnection lines in the interconnection layer 20, the second light blocking pattern 61 and the second contact CT2.

According to one or more embodiments, after the formation of the conformal semiconductor layer BSIL, a portion of the semiconductor layer BSIL may be oxidized to form the oxidized semiconductor pattern 154, and a remaining portion of the semiconductor layer BSIL may be formed into the semiconductor pattern 153. Since the thickness of the semiconductor layer BSIL is substantially uniform, warpage and pattern shift phenomenon may be prevented when the first filling layer 155L and the second filling layer 157L are formed, and thus the method of manufacturing the image sensor with improved efficiency may be provided.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. An image sensor comprising:
   a substrate comprising:
      a plurality of pixel regions;
      a first surface; and
      a second surface that is opposite to the first surface; and
   a deep device isolation pattern penetrating the substrate and between the plurality of pixel regions, the deep device isolation pattern comprising:
      a first filling pattern adjacent to the second surface;
      a second filling pattern on the first filling pattern and adjacent to the first surface;
      a semiconductor pattern between the first filling pattern and the substrate;
      an oxidized semiconductor pattern on the semiconductor pattern and between the substrate and the second filling pattern; and
      a side insulating pattern between the semiconductor pattern and the substrate,
   wherein the semiconductor pattern directly contacts the oxidized semiconductor pattern.

2. The image sensor of claim 1, wherein the semiconductor pattern comprises a semiconductor material doped with at least one P-type dopant or at least one N-type dopant, and
   wherein the oxidized semiconductor pattern comprises an oxide of the semiconductor material.

3. The image sensor of claim 1, wherein the second filling pattern comprises silicon oxide.

4. The image sensor of claim 1, wherein a thickness of a top surface of the first filling pattern in a direction parallel to the first surface of the substrate is less than a thickness of a bottom surface of the first filling pattern in the direction parallel to the first surface of the substrate.

5. The image sensor of claim 1, further comprising:
   a shallow device isolation pattern adjacent to the first surface of the substrate,
   wherein a bottom surface of the shallow device isolation pattern is at a level that is substantially the same as a level of a top surface of the first filling pattern.

6. The image sensor of claim 1, wherein inner side surfaces of the semiconductor pattern are spaced apart in a first direction parallel to the first surface of the substrate,
   wherein the first filling pattern is between the inner side surfaces of the semiconductor pattern, and
   wherein a distance between the inner side surfaces of the semiconductor pattern is substantially constant along an increasing height in a second direction perpendicular to the first surface of the substrate.

7. The image sensor of claim 1, wherein the side insulating pattern comprises:
   a single layer comprising silicon oxide; or
   a multi-layer comprising silicon oxide.

8. The image sensor of claim 1, wherein the first filling pattern comprises a material that is the same as a material of the second filling pattern.

9. The image sensor of claim 1, further comprising:
   a back device isolation pattern extending from the second surface into the substrate,
   wherein the back device isolation pattern comprises a horizontal width that is greater than a horizontal width of the deep device isolation pattern in a cross-sectional view.

10. The image sensor of claim 1, wherein the substrate further comprises:
    a central region, wherein the plurality of pixel regions are in the central region; and
    an edge region surrounding the central region in a plan view, and
    wherein the image sensor further comprises a contact pattern extending in the substrate and contacting a bottom surface of the semiconductor pattern in the edge region.

11. A method of manufacturing an image sensor, the method comprising:
    preparing a substrate comprising a first surface and a second surface that is opposite to the first surface;
    forming a deep trench extending from the first surface into the substrate;
    forming a side insulating layer at least partially covering an inner surface of the deep trench;
    forming a semiconductor layer at least partially covering the side insulating layer;
    forming a first filling layer filling the deep trench on the semiconductor layer;
    forming a second trench and a first filling pattern by performing etching on the first filling layer; and
    forming an oxidized semiconductor layer by oxidizing a first portion of the semiconductor layer which is exposed by the second trench,
    wherein a second portion of the semiconductor layer that is different from the first portion of the semiconductor layer is formed into a semiconductor pattern.

12. The method of claim 11, further comprising:
    forming a device isolation layer adjacent to the first surface of the substrate,
    wherein the forming of the first filling pattern comprises:
       etching the first filling layer such that a top surface of the first filling pattern is located at a height that is substantially the same as a height of a bottom surface of the device isolation layer.

13. The method of claim 11, wherein the semiconductor layer comprises a substantially uniform thickness.

14. The method of claim 11, further comprising:

after the forming of the oxidized semiconductor layer, forming a second filling layer substantially filling the second trench, wherein the second filling layer comprises silicon oxide.

15. The method of claim 14, further comprising, after the forming of the second filling layer:

performing a planarization process in which the oxidized semiconductor layer is etched; and performing a thinning process in which an oxidized semiconductor pattern is formed.

16. The method of claim 11, wherein the forming of the semiconductor layer comprises:

depositing a preliminary semiconductor layer; and doping the preliminary semiconductor layer with at least one P-type dopant or at least one N-type dopant.

17. The method of claim 11, wherein a depth of the second trench ranges from about 50% to about 90% of a depth of the deep trench.

18. An image sensor comprising:

a substrate comprising:

a plurality of pixel regions;

a first surface; and a second surface that is opposite to the first surface, wherein the plurality of pixel regions are arranged in a first direction and a second direction that are intersecting and that are parallel to the second surface;

a deep device isolation pattern extending from the first surface into the substrate in a third direction perpendicular to the second surface and that is between the plurality of pixel regions; and a shallow device isolation pattern adjacent to the first surface, wherein the deep device isolation pattern comprises:

a first filling pattern adjacent to the second surface;

a second filling pattern on the first filling pattern and penetrating the shallow device isolation pattern;

a semiconductor pattern between the first filling pattern and the substrate;

an oxidized semiconductor pattern on the semiconductor pattern, and between the shallow device isolation pattern and the second filling pattern; and a side insulating pattern between the semiconductor pattern and the substrate.

19. The image sensor of claim 18, wherein the semiconductor pattern comprises a semiconductor material doped with at least one P-type dopant or at least one N-type dopant, and wherein the oxidized semiconductor pattern comprises an oxide of the semiconductor material.

20. The image sensor of claim 19, wherein the semiconductor pattern comprises silicon doped with boron, and wherein the oxidized semiconductor pattern comprises silicon oxide doped with boron.

* * * * *